United States Patent
Yang et al.

(10) Patent No.: US 12,108,523 B2
(45) Date of Patent: Oct. 1, 2024

(54) PRINTED CIRCUIT BOARD FOR REDUCING POWER NOISE AND ELECTRONIC DEVICE INCLUDING THE SAME

(71) Applicant: Samsung Electronics Co., LTD., Gyeonggi-do (KR)

(72) Inventors: Kwangmo Yang, Gyeonggi-do (KR); Bumhee Bae, Gyeonggi-do (KR); Younho Kim, Gyeonggi-do (KR); Changwon Jang, Gyeonggi-do (KR); Jeongnam Cheon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 117 days.

(21) Appl. No.: 17/948,339

(22) Filed: Sep. 20, 2022

(65) Prior Publication Data

US 2023/0084535 A1    Mar. 16, 2023

Related U.S. Application Data

(63) Continuation of application No. PCT/KR2022/009719, filed on Jul. 6, 2022.

(30) Foreign Application Priority Data

Sep. 9, 2021    (KR) ........................ 10-2021-0120140

(51) Int. Cl.
   *H05K 1/02*        (2006.01)
   *G06F 1/16*        (2006.01)

(52) U.S. Cl.
   CPC ......... *H05K 1/0225* (2013.01); *G06F 1/1698* (2013.01); *H05K 2201/0195* (2013.01); *H05K 2201/10098* (2013.01)

(58) Field of Classification Search
   CPC .. H05K 1/0225; H05K 1/0231; H05K 1/0233; H05K 1/16; H05K 1/162; H05K 2201/0195
   See application file for complete search history.

(56) References Cited

U.S. PATENT DOCUMENTS 5,926,377 A * 7/1999 Nakao .................. H05K 1/0227
                                                174/262
6,075,211 A    6/2000 Tohya et al.
(Continued)

FOREIGN PATENT DOCUMENTS

JP    9-246775 A    9/1997
JP    2001-53449 A    2/2001
(Continued)

OTHER PUBLICATIONS

International Search Report dated Oct. 20, 2022.
Extended European Search Report dated Aug. 23, 2024.

*Primary Examiner* — Hoa C Nguyen
(74) *Attorney, Agent, or Firm* — Cha & Reiter, LLC

(57) ABSTRACT

An electronic device according to an example embodiment includes a printed circuit board (PCB) configured to connect a first electronic component and a second electronic component and block power noise in a target frequency band. The PCB may include a first signal layer including a first signal plate having a length pattern with a length corresponding to a first parameter of the target frequency band, a first ground layer including a first ground plate with a first area, a second signal layer including a second signal plate, a first dielectric having a first thickness and a first permittivity, a second ground layer including a second ground plate with a second area corresponding to a second parameter of the target frequency band, and a second dielectric having a second thickness and a second permittivity corresponding to the second parameter.

24 Claims, 18 Drawing Sheets

(56) References Cited

U.S. PATENT DOCUMENTS

| | | | |
|---|---|---|---|
| 6,175,727 B1 | 1/2001 | Mostov | |
| 6,448,873 B1 * | 9/2002 | Mostov | H03H 7/1775 |
| | | | 333/184 |
| 8,053,673 B2 | 11/2011 | Kim et al. | |
| 10,056,660 B2 | 8/2018 | Doyle et al. | |
| 2003/0011424 A1 | 1/2003 | Moon et al. | |
| 2004/0118600 A1 * | 6/2004 | Lee | H05K 1/162 |
| | | | 174/260 |
| 2007/0001926 A1 * | 1/2007 | Waltho | H01Q 15/0026 |
| | | | 343/909 |
| 2008/0099231 A1 | 5/2008 | Chang et al. | |
| 2008/0104833 A1 * | 5/2008 | Kariya | H05K 1/162 |
| | | | 174/250 |
| 2008/0212283 A1 * | 9/2008 | Chernyakov | H05K 1/0207 |
| | | | 257/E23.105 |
| 2010/0181101 A1 | 7/2010 | Han et al. | |
| 2013/0265736 A1 * | 10/2013 | Rokuhara | H05K 1/0236 |
| | | | 174/32 |
| 2014/0049343 A1 * | 2/2014 | Sakai | H01P 7/08 |
| | | | 333/219 |
| 2014/0247574 A1 * | 9/2014 | Tamaki | H01L 23/642 |
| | | | 174/251 |

FOREIGN PATENT DOCUMENTS

| | | |
|---|---|---|
| JP | 2002-223077 A | 8/2002 |
| JP | 2013-187249 A | 9/2013 |
| KR | 10-0712121 B1 | 4/2007 |
| KR | 10-0814294 B1 | 3/2008 |
| KR | 10-2019-0091949 A | 8/2019 |
| KR | 10-2020-0028622 A | 3/2020 |
| KR | 10-2021-0073999 A | 6/2021 |
| KR | 10-2021-0081968 A | 7/2021 |

* cited by examiner

PRINTED CIRCUIT BOARD FOR REDUCING POWER NOISE AND ELECTRONIC DEVICE INCLUDING THE SAME

CROSS-REFERENCE TO RELATED APPLICATIONS

This application is a continuation of International Application No. PCT/KR2022/009719 designating the United States, filed on Jul. 6, 2022, in the Korean Intellectual Property Receiving Office and claiming priority to Korean Patent Application No. 10-2021-0120140, filed on Sep. 9, 2021, in the Korean Intellectual Property Office, the disclosures of which are incorporated by reference herein in their entireties.

BACKGROUND

1. Field

One or more embodiments of the instant disclosure generally relate to an electronic device, for example, to an electronic device including a printed circuit board (PCB) for reducing power noise.

2. Description of Related Art

To transmit signals from a circuit board to an electronic component (e.g., communication module or camera module) in an electronic device, a flexible printed circuit board (FPCB) that connects the circuit board and the electronic component may be deployed. Signal transmission characteristics (e.g., insertion loss) may be determined according to the design of the printed circuit board (PCB), and noise (e.g., power noise) may be emitted from the PCB to its external environment according to the frequency characteristics (e.g., impedance) that depend on the design of lines of the PCB. Power noise may be noise generated when voltage vary from a desired voltage level, and may negatively impact the reduce performance of the electronic component (e.g., communication module).

SUMMARY

Certain embodiments disclosed herein may provide an electronic device that may reduce power noise.

An electronic device according to an example embodiment includes a first electronic component, a second electronic component, and a printed circuit board (PCB) configured to connect the first electronic component and the second electronic component and block power noise in a target frequency band. The PCB may include a first signal layer including a first signal plate having a length pattern with a length corresponding to a first parameter of the target frequency band, a first ground layer including a first ground plate that is positioned below the first signal plate and that has a first area, a second signal layer including a second signal plate positioned below the first ground plate, a first dielectric positioned between the first ground plate and the second signal plate and having a first thickness and a first permittivity, a second ground layer including a second ground plate that is positioned below the second signal plate and that has a second area corresponding to a second parameter of the target frequency band, and a second dielectric positioned between the second signal plate and the second ground plate and having a second thickness and a second permittivity corresponding to the second parameter.

A PCB according to an example embodiment may be a PCB configured to block power noise in a target frequency band. The PCB may include a first signal layer including a first signal plate having a length pattern with a length corresponding to a first parameter of the target frequency band, a first ground layer including a first ground plate that is positioned below the first signal plate and that has a first area, a second signal layer including a second signal plate positioned below the first ground plate, a first dielectric positioned between the first ground plate and the second signal plate and having a first thickness and a first permittivity, a second ground layer including a second ground plate that is positioned below the second signal plate and that has a second area corresponding to a second parameter of the target frequency band, and a second dielectric positioned between the second signal plate and the second ground plate and having a second thickness and a second permittivity corresponding to the second parameter.

An electronic device according to an example embodiment includes a power management module, an antenna module, and a flexible printed circuit board (FPCB) configured to connect the power management module and the antenna module and block power noise in a target frequency band. The FPCB may include a first signal layer including a first signal plate having a length pattern with a length corresponding to an inductance of the target frequency band, a first ground layer including a first ground plate that is positioned below the first signal plate and that has a first area, a second signal layer including a second signal plate positioned below the first ground plate, a first dielectric positioned between the first ground plate and the second signal plate and having a first thickness and a first permittivity, a second ground layer including a second ground plate that is positioned below the second signal plate and that has a second area corresponding to a capacitor of the target frequency band, and a second dielectric positioned between the second signal plate and the second ground plate and having a second thickness and a second permittivity corresponding to the capacitance.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
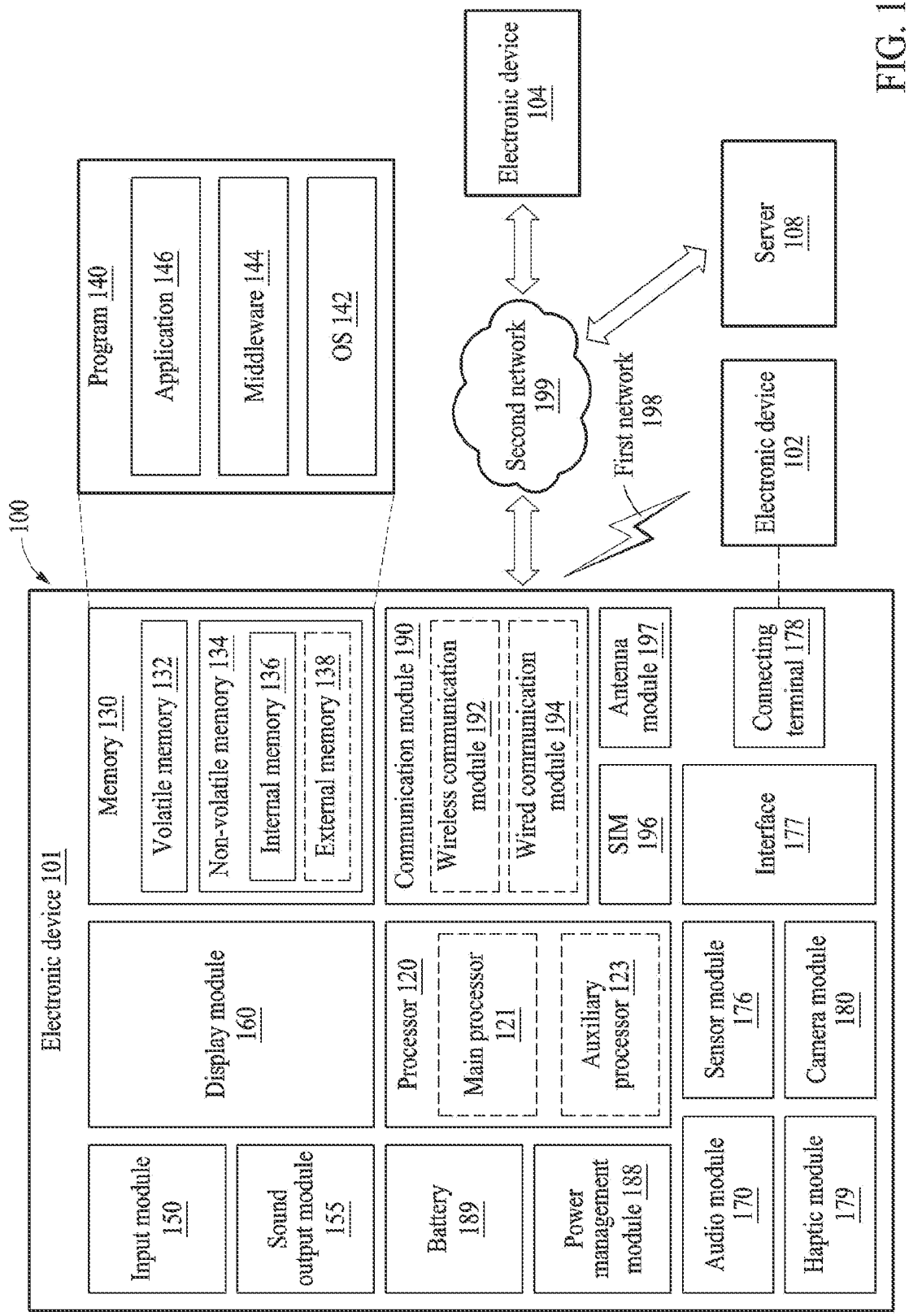
FIG. 1 is a block diagram illustrating an electronic device in a network environment according to an example embodiment.

According to certain example embodiments disclosed herein, power noise (e.g., simultaneous switching noise) may be reduced by implementing a layout of a printed circuit board (PCB) for reducing the power noise, where the layout does not require a separate component for reducing noise (e.g., decoupling capacitor). Aspects of the PCB and an electronic device including the same according to certain example embodiments are not limited to the above-mentioned advantages, and other unmentioned advantages or aspects of the electronic device can be clearly understood from the following description by one of ordinary skill in the art.

Hereinafter, certain example embodiments will be described in greater detail with reference to the accompanying drawings. When describing the example embodiments with reference to the accompanying drawings, like reference numerals refer to like elements and a repeated description related thereto will be omitted.

FIG. 1 is a block diagram illustrating an electronic device in a network environment according to an example embodiment.

Referring to FIG. 1, an electronic device 101 in a network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display device 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local region network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide region network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to certain example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more external electronic devices (e.g., the external devices 102 and 104, and the server 108). For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that certain example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

According to certain example embodiments, each component (e.g., a module or a program) of the above-described components may include a single entity or multiple entities, and some of the multiple entities may be separately disposed in different components. According to certain example embodiments, one or more of the above-described components may be omitted, or one or more other components may be added. Alternatively or additionally, a plurality of components (e.g., modules or programs) may be integrated into a single component. In such a case, according to certain example embodiments, the integrated component may still perform one or more functions of each of the plurality of components in the same or similar manner as they are performed by a corresponding one of the plurality of components before the integration.

Figure 2A:
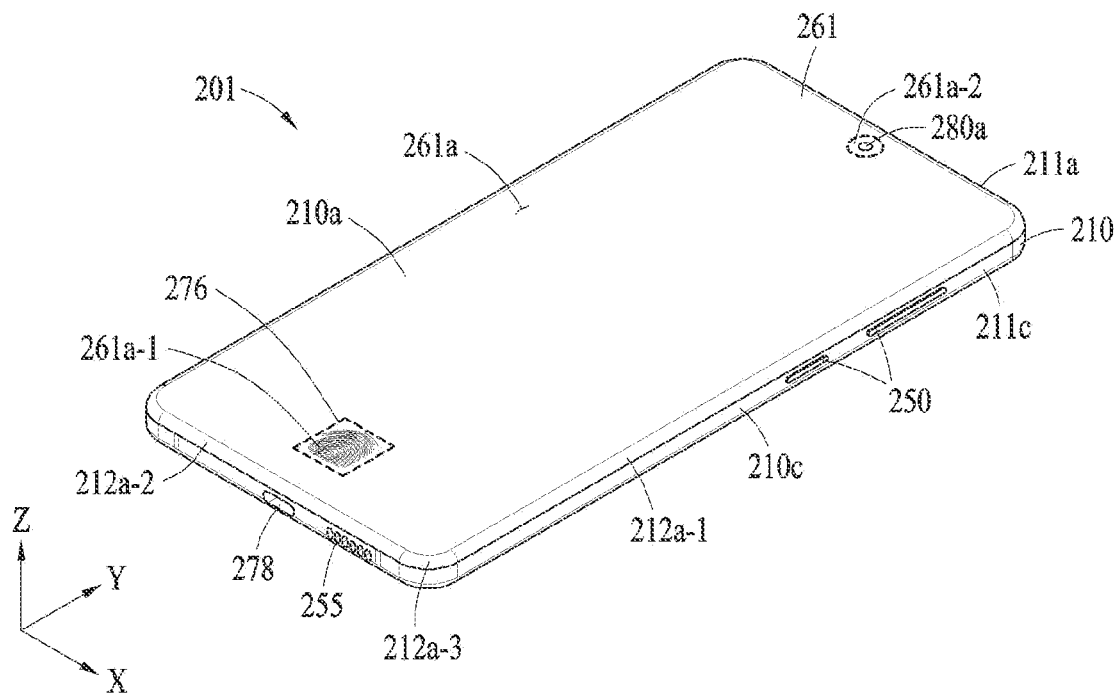
FIG. 2A is a perspective view of an electronic device viewed in one direction according to an example embodiment.
Figure 2B:
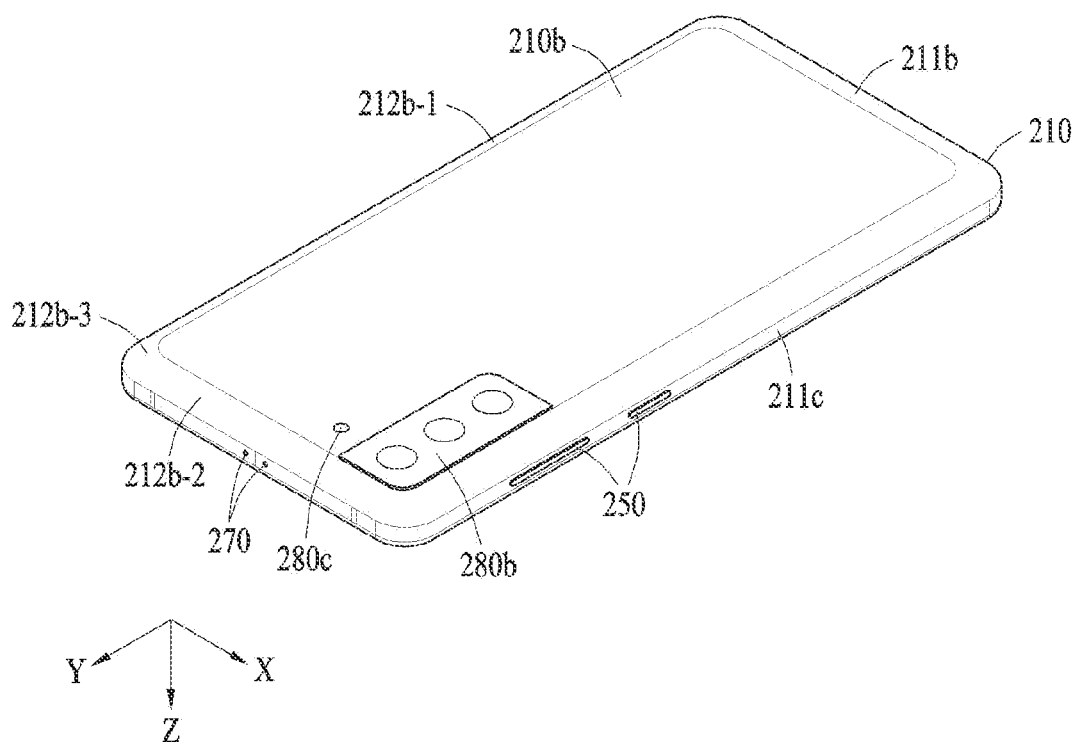
FIG. 2B is a perspective view of an electronic device viewed in another direction according to an example embodiment.
Figure 2C:
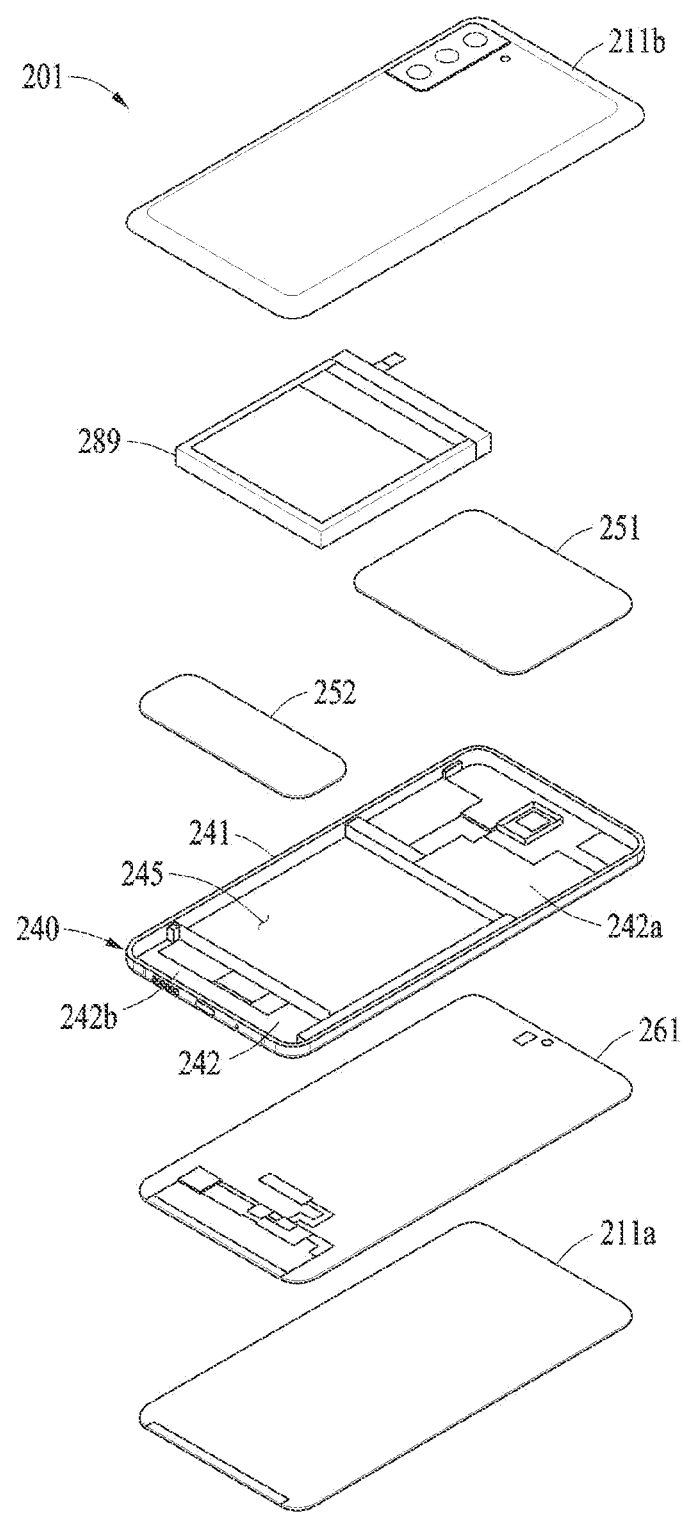
FIG. 2C is an exploded perspective view of an electronic device according to an example embodiment.

Referring to FIGS. 2A to 2C, an electronic device 201 (e.g., the electronic device 101 of FIG. 1) may include a housing 210 including a first surface 210a (e.g., front surface), a second surface 210b (e.g., rear surface), and a third surface 210c (e.g., side surface) enclosing a space between the first surface 210a and the second surface 210b.

In an example embodiment, the first surface 210a may be formed by a first plate 211a of which at least a portion is substantially transparent. For example, the first plate 211a may be at least partially implemented by a polymer plate or a glass plate including at least one coating layer. The second surface 210b may be implemented by a second plate 211b that is substantially opaque. For example, the second plate 211b may be made of coated or tinted glass, ceramic, polymer, metal (e.g., aluminum, stainless steel (STS), or magnesium), or a combination thereof. The third surface 210c may be implemented by a frame 211c that is coupled to the first plate 211a and the second plate 211b and includes metal and/or polymer. In an example embodiment, the second plate 211b and the frame 211c may be integrated and seamlessly formed. In an example embodiment, the second plate 211b and the frame 211c may be made of substantially the same material (e.g., aluminum).

In an example embodiment, the first plate 211a may include a plurality of first periphery areas 212a-1 that are rounded in the direction from at least one area of the first surface 210a toward the second plate 211b and extend in one direction (e.g., the +/−Y direction), a plurality of second periphery areas 212a-2 that are rounded in the direction from at least one area of the first surface 210a toward the second plate 211b and extend in another direction (e.g., the +/−X direction), and a plurality of third periphery areas 212a-3 that are rounded in the direction from at least one area of the first surface 210a toward the second plate 211b and positioned between the plurality of first periphery areas 212a-1 and the plurality of second periphery areas 212a-2. In an example embodiment, the second plate 211b may include a plurality of fourth periphery areas 212b-1 that are rounded in the direction from at least one area of the second surface 210b toward the first plate 211a and extend in one direction (e.g., the +/−Y direction), a plurality of fifth periphery areas 212b-2 that are rounded in the direction from at least one area of the second surface 210b toward the first plate 211a and extend in the other direction (e.g., the +/−X direction), and a plurality of sixth periphery areas 212b-3 that are rounded in the direction from at least one area of the second surface 210b toward the first plate 211a and positioned between the plurality of fourth periphery areas 212b-1 and the plurality of fifth periphery areas 212b-2.

The electronic device 201 may include a display 261 (e.g., the display module 160). In an example embodiment, the display 261 may be positioned on the first surface 210a. In an example embodiment, the display 261 may be exposed through at least a portion (e.g., the portion delineated by the plurality of first periphery areas 212a-1, the plurality of second periphery areas 212a-2, and the plurality of third periphery areas 212a-3) of the first plate 211a. In an example embodiment, the display 261 may have a shape that is substantially the same as the shape of the outer edge of the first plate 211a. In some example embodiments, the periphery of the display 261 may substantially coincide with the outer edge of the first plate 211a. In an example embodiment, the display 261 may include a touch sensing circuit, a pressure sensor for measuring intensity (pressure) of touches, and/or a digitizer for detecting a magnetic-type stylus pen. In an example embodiment, the display 261 may include a screen display area 261a that is visually exposed to display content using pixels or voxels. In an example embodiment, the screen display area 261a may include a sensing area 261a-1 and/or a camera area 261a-2. The sensing area 261a-1 may overlap at least one area of the screen display area 261a. The sensing area 261a-1 may allow transmission of input signal(s) related to a sensor module 276 (e.g., the sensor module 176). The sensing area 261a-1 may display content, like the screen display area 261a that does not overlap the sensing area 261a-1. For example, the sensing area 261a-1 may display the content while the sensor module 276 is not operating. The camera area 261a-2 may overlap at least one area of the screen display area 261a. The camera area 261a-2 may allow transmission of optical signal(s) related to a first camera module 280a (e.g., the camera module 180). The camera area 261a-2 may display content, like the screen display area 261a that does not overlap the camera area 261a-2. For example, the camera area 261a-2 may display the content while the first camera module 280a is not operating.

The electronic device 201 may include an audio module 270 (e.g., the audio module 170). In an example embodiment, the audio module 270 may be positioned on the third surface 210c. In an example embodiment, the audio module 270 may obtain sound through at least one hole.

The electronic device 201 may include the sensor module 276. In an example embodiment, the sensor module 276 may be positioned on the first surface 210a. The sensor module 276 may be disposed to coincide with the sensing area 261a-1 in at least a portion of the screen display area 261a. The sensor module 276 may receive an input signal transmitted through the sensing area 261a-1 and generate an electrical signal based on the received input signal. As an example, the input signal may correspond to a particular physical quantity (e.g., heat, light, temperature, sound, pressure, or ultrasound). As an example, the input signal may include a signal related to biometric information (e.g., fingerprint) of a user.

The electronic device 201 may include the first camera module 280a, a second camera module 280b (e.g., the camera module 180), and a flash 280c. In an example embodiment, the first camera module 280a may be positioned on the first surface 210a, and the second camera module 280b and the flash 280c may be positioned on the second surface 210b. In an example embodiment, at least a portion of the first camera module 280a may be positioned under the display 261. In an example embodiment, the first camera module 280a may receive optical signal(s) transmitted through the camera area 261a-2. In an example embodiment, the second camera module 280b may include a plurality of camera modules (e.g., implemented as a dual camera, a triple camera, or a quad camera). In an example embodiment, the flash 280c may include a light-emitting diode or a xenon lamp.

The electronic device 201 may include a sound output module 255 (e.g., the sound output module 155). In an example embodiment, the sound output module 255 may be positioned on the third surface 210c. In an example embodiment, the sound output module 255 may include one or more holes.

The electronic device 201 may include an input module 250 (e.g., the input module 150). In an example embodiment, the input module 250 may be positioned on the third surface 210c. In an example embodiment, the input module 250 may include at least one key input device.

The electronic device 201 may include a connecting terminal 278 (e.g., the connecting terminal 178). In an example embodiment, the connecting terminal 278 may be positioned on the third surface 210c. For example, when the electronic device 201 is viewed in one direction (e.g., the +Y direction), the connecting terminal 278 may be positioned at a central portion of the third surface 210c, and the sound output module 255 may be positioned on one side (e.g., right side) with respect to the connecting terminal 278.

The electronic device 201 may include a support body 240, a first circuit board 251, a second circuit board 252, and a battery 289 (e.g., the battery 189). At least a portion of the support body 240 may form the housing 210 together with the first plate 211a and the second plate 211b. In an example embodiment, the support body 240 may include a frame structure 241 (e.g., the frame 211c) and a plate structure 242. The frame structure 241 may be formed to surround the periphery of the plate structure 242. The frame structure 241 may connect the periphery of the first plate 211a and the periphery of the second plate 211b, surround the space between the first plate 211a and the second plate 211b, and form the third surface 210c of the electronic device 201. The plate structure 242 may include a first portion 242a for accommodating the first circuit board 251 and a second portion 242b for accommodating the second circuit board 252. The display 261 may be positioned on one surface (e.g., bottom surface as shown in FIG. 2C) of the plate structure 242, and the first circuit board 251 and the second circuit board 252 may be positioned on the other surface (e.g., top surface as shown in FIG. 2C) of the plate structure 242. In an example embodiment, the plate structure 242 may include an opening 245 positioned between the first portion 242a and the second portion 242b and passing through both surfaces of the plate structure 242. The opening 245 may accommodate the battery 289.

Figure 3A:
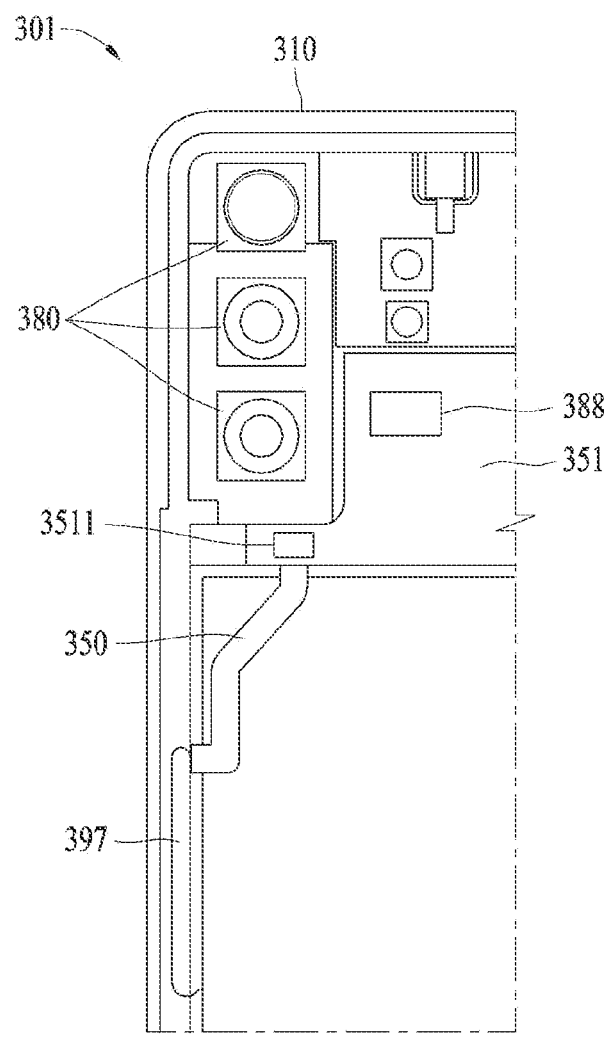
FIG. 3A is a plan view of a portion of a structure of an electronic device according to an example embodiment.
Figure 3B:
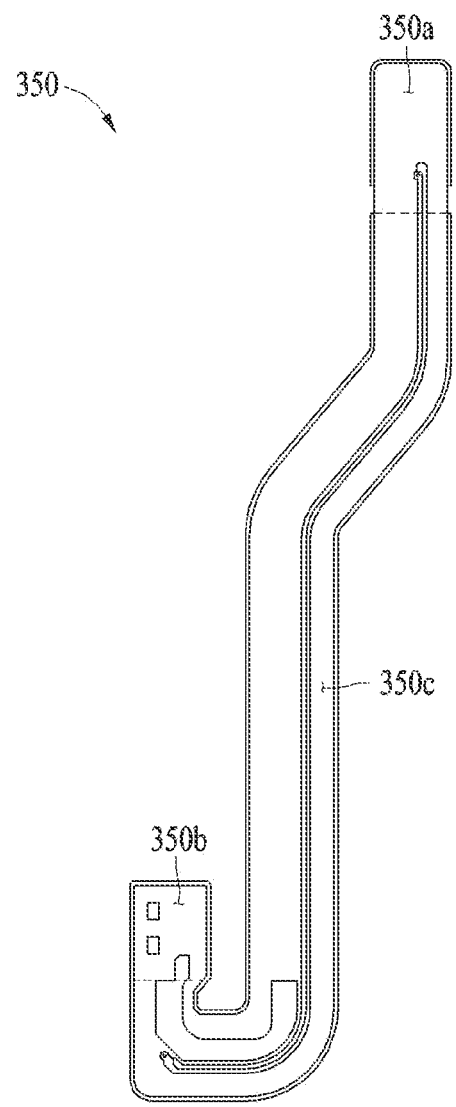
FIG. 3B is a plan view of a printed circuit board (PCB) according to an example embodiment.
Figure 4A:
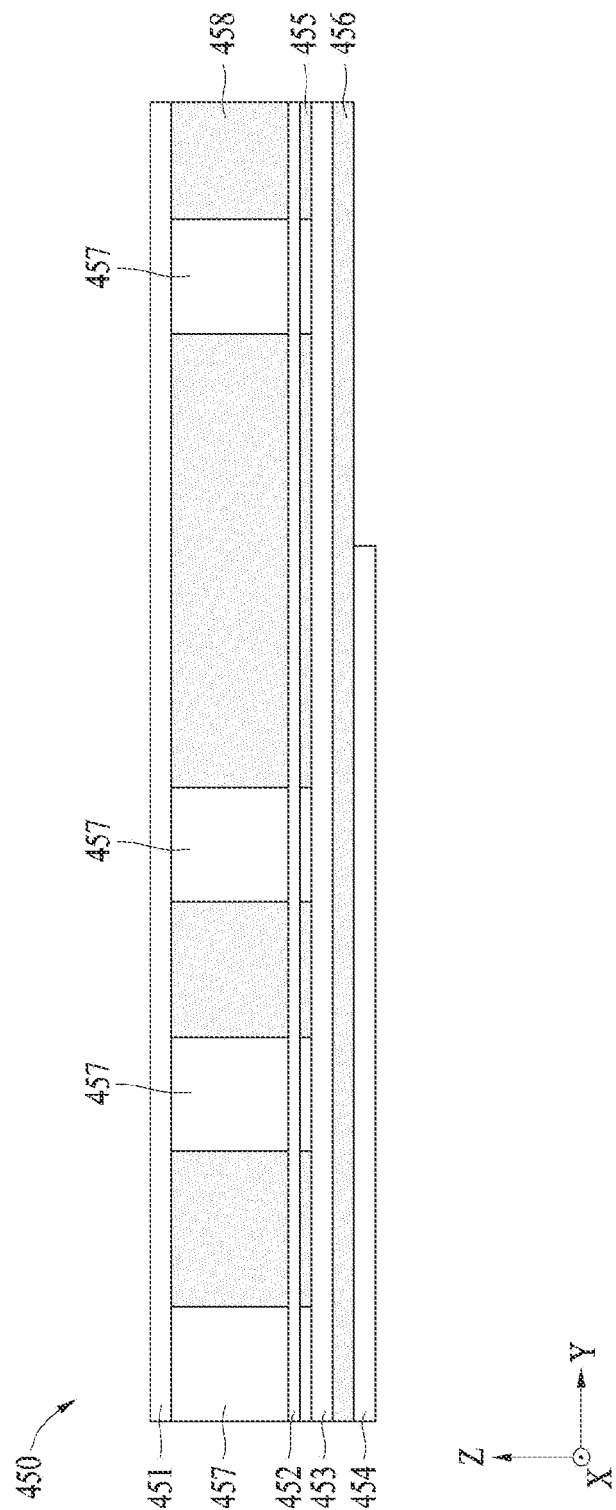
FIG. 4A is a side view of a PCB according to an example embodiment.
Figure 4B:
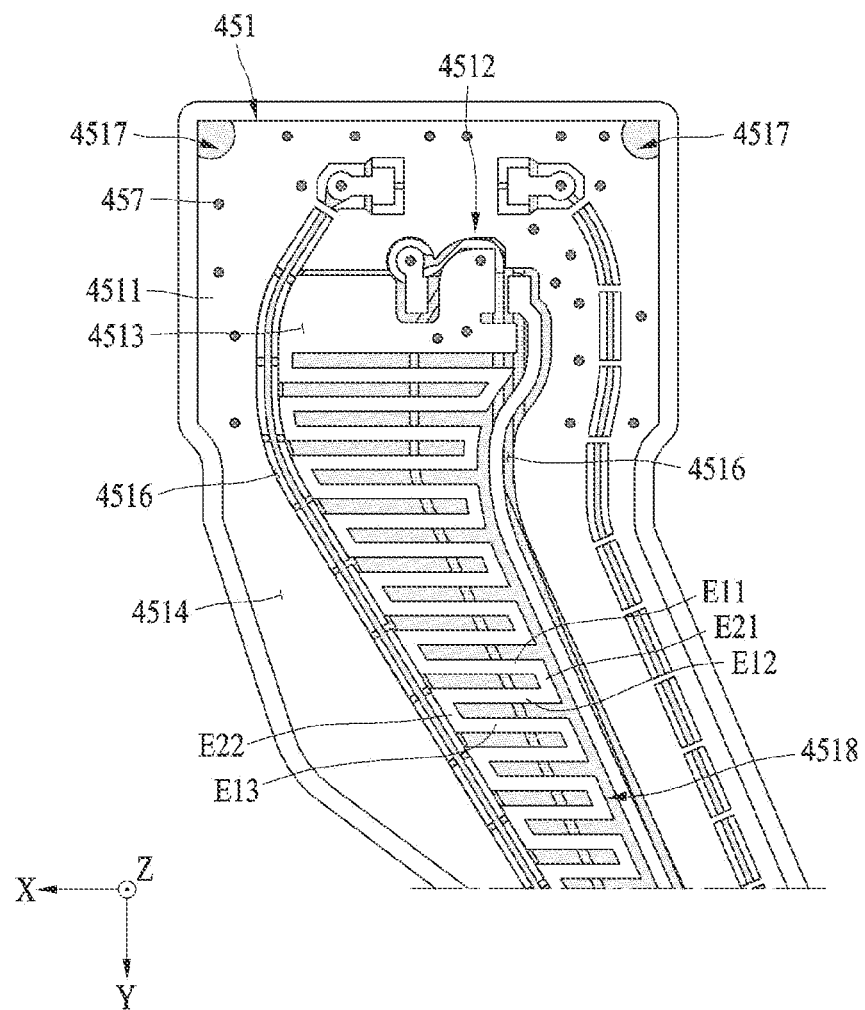
FIG. 4B is a plan view of a first signal layer of a PCB according to an example embodiment.
Figure 4C:
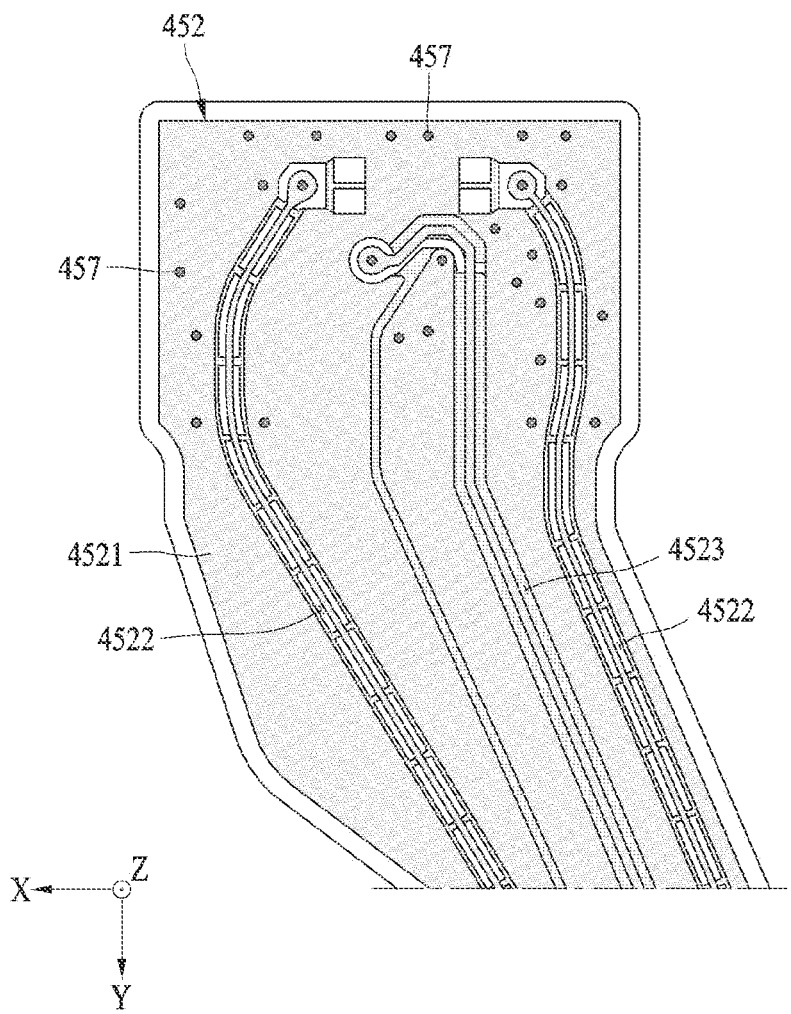
FIG. 4C is a plan view of a first ground layer of the PCB without the first signal layer according to an example embodiment.
Figure 4D:
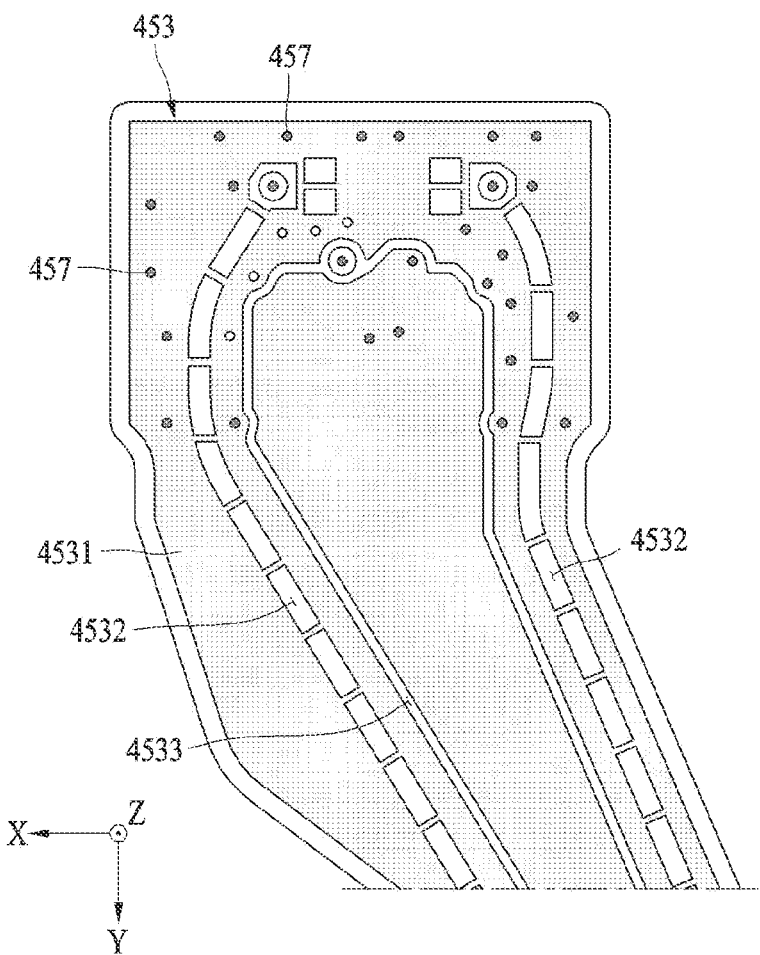
FIG. 4D is a plan view of a second signal layer of the PCB without the first signal layer and the first ground layer according to an example embodiment.
Figure 4E:
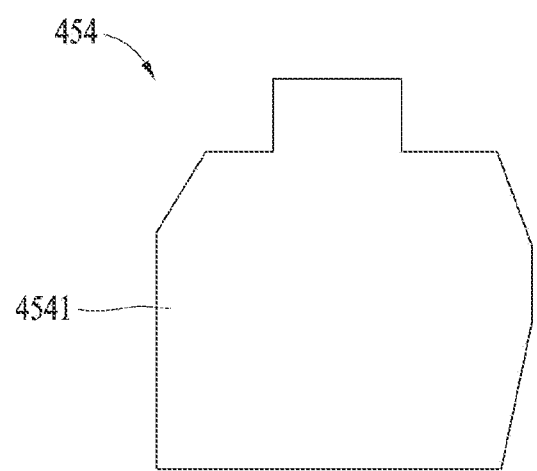
FIG. 4E is a plan view of a second ground layer of the PCB without the first signal layer, the first ground layer, and the second signal layer according to an example embodiment.
Figure 5A:
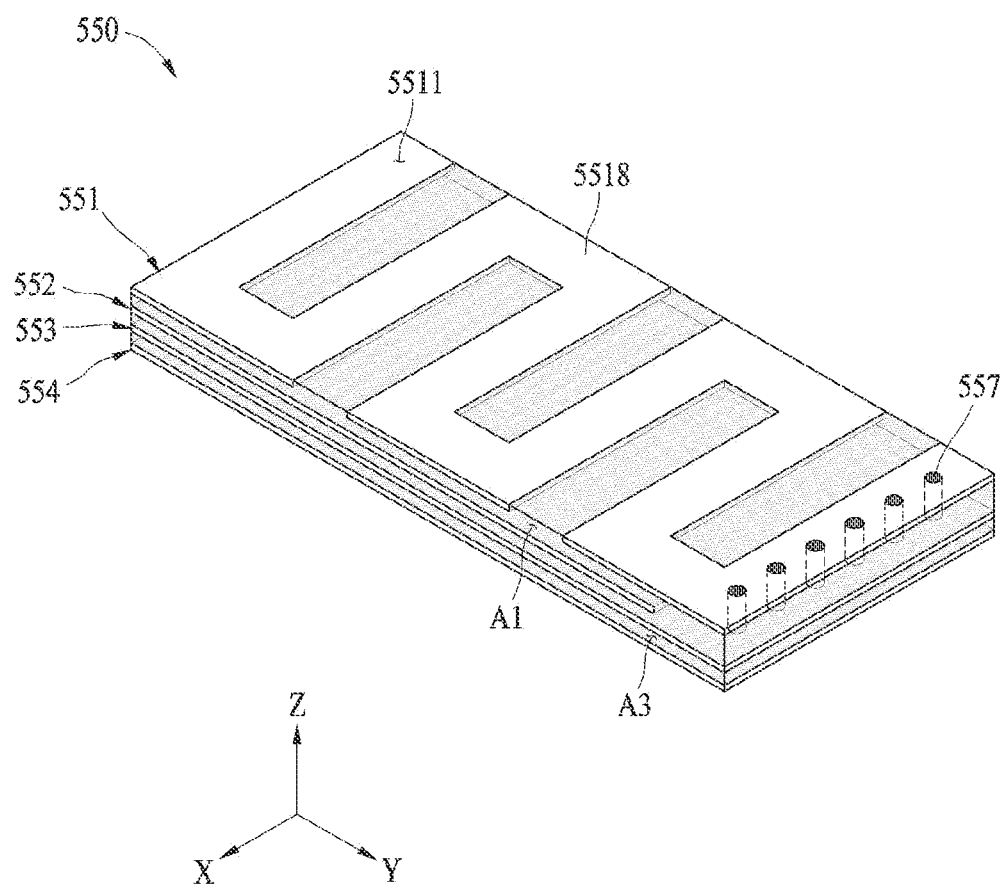
FIG. 5A is a perspective view schematically illustrating a flexible PCB (FPCB) according to an example embodiment.
Figure 5B:
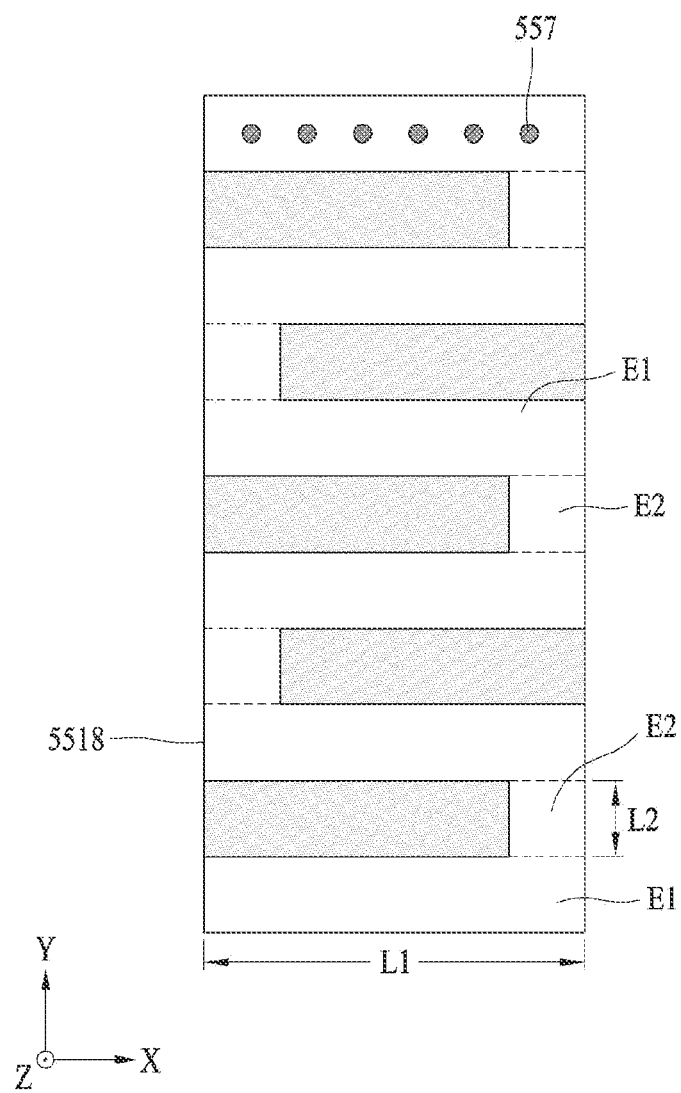
FIG. 5B is a plan view schematically illustrating an FPCB according to an example embodiment.
Figure 5C:
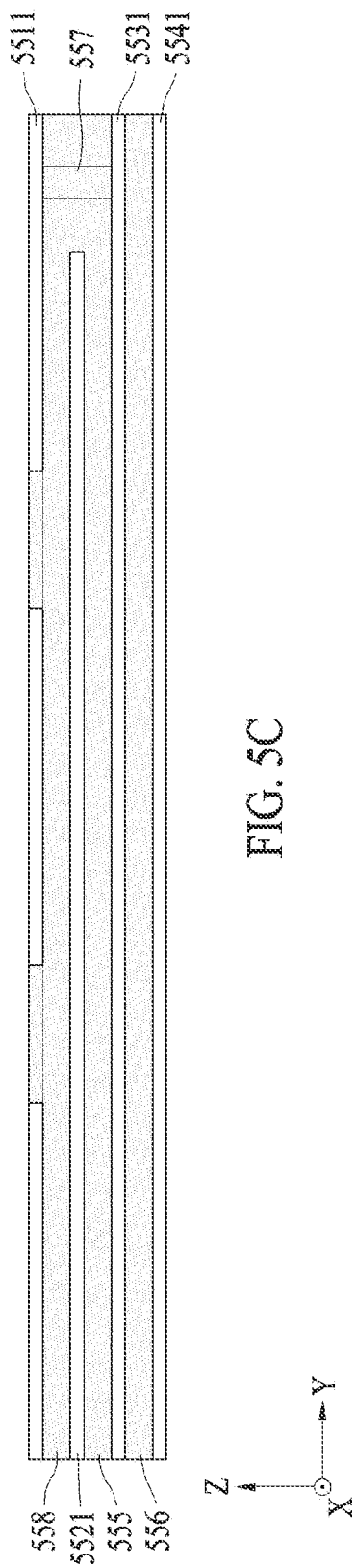
FIG. 5C is a side view of an FPCB viewed in one direction according to an example embodiment.
Figure 5D:
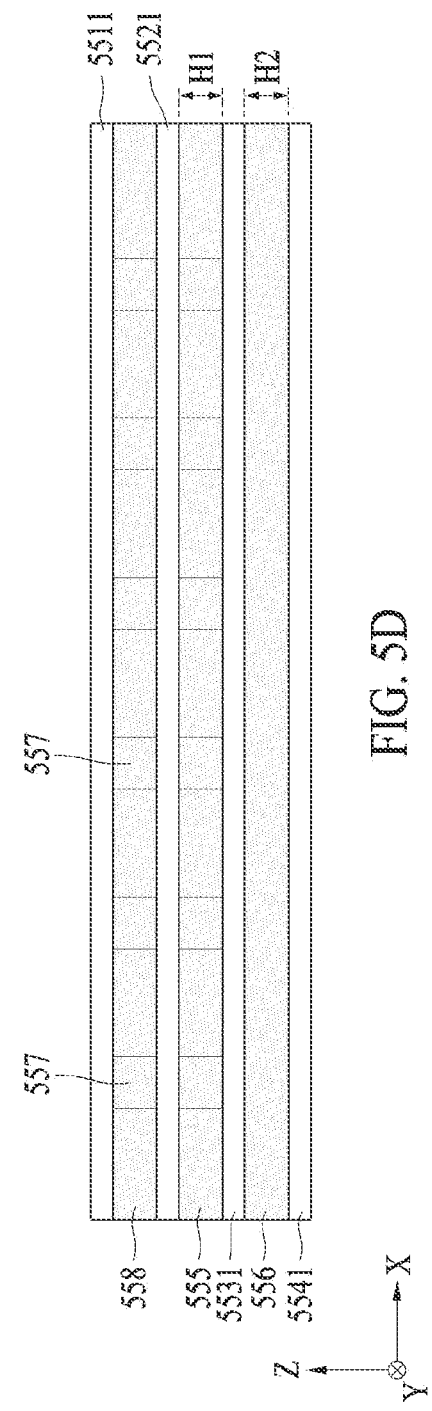
FIG. 5D is a side view of an FPCB viewed in another direction according to an example embodiment.

Referring to FIGS. 3A and 3B, an electronic device 301 (e.g., the electronic device 201 of FIGS. 2A to 2C) according to an example embodiment may include a housing 310 (e.g., the housing 210), a camera module 380 (e.g., the second camera module 280b), and a circuit board 351 (e.g., the first circuit board 251).

The electronic device 301 may include a connector 3511 positioned on the circuit board 351, an antenna module 397 (e.g., the antenna module 197 or mmWave antenna module of FIG. 1) positioned in the housing 310, and a PCB 350 configured to connect an electronic component 388 (e.g., PMIC or 5G modem of the power management module 188 of FIG. 1) on the circuit board 351 to the antenna module 397 (e.g., PMIC or RFIC of the antenna module 397). The PCB 350 may include a first connector section 350a connected to the connector 3511, a second connector section 350b connected to the antenna module 397, and a wiring connection section 350c between the first connector section 350a and the second connector sections 350b. In an example embodiment, the PCB 350 may be a flexible printed circuit board (FPCB).

In certain example embodiments of the present disclosure, the electronic component 388 (e.g., the PMIC or 5G modem of the power management module 188 of FIG. 1) on the circuit board 351 may be referred to as a first electronic component, the antenna module 397 may be referred to as a second electronic component, and the PCB 350 may connect the first electronic component and the second electronic component. However, the example embodiments are not limited thereto. For example, the PCB 350 may connect the camera module 380 or the first camera module 280a of FIG. 2A and the antenna module 397 or an array (not shown) of a plurality of antennas on the circuit board 351. In that case, the camera module 380 or the first camera module 280a of FIG. 2A may be referred to as the first electronic component, and the antenna module 397 or the array of the plurality of antennas may be referred to as the second electronic component.

In an example embodiment, the first electronic component (e.g., the PMIC or 5G modem of the power management module 188 of FIG. 1) and the second electronic component (e.g., the antenna module 397) may transmit and receive high-speed signals or power signals via the PCB 350. The PCB 350 may be configured to reduce radiation of power noise (e.g., simultaneous switching noise) that may be generated between the first electronic component and the second electronic component. In an example embodiment, the PCB 350 may be configured to reduce the magnitude of impedance in a target frequency band. In an example embodiment, around the first connector section 350a or the second connector section 350b of the PCB 350 and/or around a connector section of the circuit board 351, a decoupling capacitor, a lead pattern, and a via structure for the decoupling capacitor may be omitted.

Referring to FIGS. 4A to 4E, a PCB 450 (e.g., the PCB 350 of FIGS. 3A and 3B) according to an example embodiment may include a first signal layer 451, a first ground layer 452, a second signal layer 453, a second ground layer 454, a first dielectric 455, a second dielectric 456, and a plurality of vias 457. In an example embodiment, the PCB 450 may have a structure in which the first signal layer 451, the first ground layer 452, the first dielectric 455, the second signal layer 453, the second dielectric 456, and the second ground layer 454 are sequentially stacked in a stacking direction (e.g., the -Z direction in FIG. 4A). In an example embodiment, the plurality of vias 457 may connect the first signal layer 451 and the second signal layer 453.

In an example embodiment, the first ground layer 452 and the first dielectric 455 may be disposed on one side (e.g., upper portion) of the second signal layer 453, and the second ground layer 454 and the second dielectric 456 may be disposed on another side (e.g., lower portion) of the second signal layer 453, and accordingly the PCB 450 may have a double-sided capacitance structure. The total capacitance $C_{tot}$ determined by the double-sided capacitance structure of the PCB 450 may be the sum of a first capacitance $C_1$ between the second signal layer 453 and the first ground layer 452, which may vary according to the first dielectric 455 disposed on the one side (e.g., upper portion) of the second signal layer 453, and a second capacitance $C_2$ between the second signal layer 453 and the second ground layer 454, which may vary according to the second dielectric 456 disposed on the other side (e.g., lower portion) of the second signal layer 453. In other words, the double-sided capacitance structure of the PCB 450 may have a parallel capacitance structure.

The first signal layer 451 may include a first signal plate 4511. The first signal layer 451 may have a structure in which a dielectric 458 (e.g., third dielectric) is bonded to one surface of the first signal plate 4511 (e.g., the lower surface in FIG. 4A). The first signal plate 4511 may be made of a copper clad laminate (CCL).

In an example embodiment, the first signal plate 4511 may include a connector section 4512 configured to accommodate a connector (not shown) to connect an electronic component (e.g., the electronic component 388 or the antenna module 397 of FIG. 3).

In an example embodiment, the first signal plate 4511 may include a stub section 4513 and a non-stub section 4514. The stub section 4513 and the non-stub section 4514 may be spaced apart from each other by a gap, and a slot 4516 may be formed between the stub section 4513 and the non-stub section 4514.

In an example embodiment, the first signal plate 4511 may have a plurality of corners, and may include a cut-off portion 4517 formed in at least one of the plurality of corners.

In an example embodiment, the first signal plate 4511 may include a length pattern 4518 formed in at least a partial region of the first signal plate 4511. Here, the "length pattern" may refer to a pattern that substantially includes elements in a longitudinal direction. Patterns including only elements in the longitudinal direction may also be referred to as "length pattern." Accordingly, the length pattern may have a physically measurable "length," and the length of the length pattern may have influence on a parameter (e.g., inductance) of a target frequency band of noise to be reduced by the PCB 450. In some example embodiments, the length pattern 4518 may be formed in at least a partial region of the stub section 4513.

In an example embodiment, the length pattern 4518 may have a meander or zigzag pattern. The length pattern 4518 may include a plurality of first extensions E11, E12, and E13 that extend in a first direction (e.g., the +/−X direction) on the first signal plate 4511 to progress in a second direction (e.g., the +Y direction) different from the first direction, and a plurality of second extensions E21 and E22 that connect the plurality of first extensions E11, E12, and E13 and extend from each of the plurality of first extensions E11, E12, and E13. For example, the second extension E21 may connect an end portion (e.g., right end portion in FIG. 4B) of the first extension E11 and an end portion (e.g., right end portion in FIG. 4B) of the first extension E12 adjacent to the first extension E11 and may extend between the end portions. Also, the second extension E22 may connect another end portion (e.g., left end portion in FIG. 4B) of the first extension E12 and an end portion (e.g., left end portion in FIG. 4B) of the first extension E13 adjacent to the first extension E12 and may extend between the end portions.

In an example embodiment, the plurality of first extensions E11, E12, and E13 may extend in substantially the same direction (e.g., the +/−X direction) or may extend in directions substantially opposite to each other.

In an example embodiment, the plurality of second extensions E21 and E22 may extend along at least a portion of the slot 4516 between the stub section 4513 and the non-stub section 4514.

In an example, the length of each of the plurality of first extensions E11, E12, and E13 may be greater than the length of each of the plurality of second extensions E21 and E22. In an example, the length of each of the plurality of first extensions E11, E12, and E13 may be substantially equal to the length of each of the plurality of second extensions E21 and E22. In an example, the length of each of the plurality of first extensions E11, E12, and E13 may be less than the length of each of the plurality of second extensions E21 and E22.

The first ground layer 452 may include a first ground plate 4521. The first ground layer 452 may have a structure in which the dielectric 458 is bonded to one surface of the first ground plate 4521 (e.g., the top surface in FIG. 4A) and in which the first dielectric 455 is bonded to the other surface of the first ground plate 4521 (e.g., the bottom surface in FIG. 4A). The first ground plate 4521 may be made of CCL.

In an example embodiment, the first ground plate 4521 may include a plurality (e.g., a pair) of second slots 4522 formed in positions corresponding to the position of the slot 4516 of the first signal plate 4511. In an example embodiment, the first ground plate 4521 may include a loop-shaped third slot 4523 disposed between the second slots 4522 and positioned below the stub section 4513 of the first signal plate 4511.

The second signal layer 453 may include a second signal plate 4531. The second signal layer 453 may have a structure in which the first dielectric 455 is bonded to one surface of the second signal plate 4531 (e.g., the top surface in FIG. 4A) and in which the second dielectric 456 is bonded to the other surface of the second signal plate 4531 (e.g., the bottom surface of FIG. 4A). The second signal plate 4531 may be made of CCL.

In an example embodiment, the second signal plate 4531 may function as a power source. In an example embodiment, the second signal plate 4531 may include a plurality of fourth slots 4532 that are formed in positions corresponding to the positions of the plurality of second slots 4522 of the first ground plate 4521 and that are spaced apart along the path of the plurality of second slots 4522. In an example embodiment, the second signal plate 4531 may include a fifth slot 4533 in a loop shape disposed between the plurality of fourth slots 4532 and below the stub section 4513 of the first signal plate 4511. The plurality of fourth slots 4532 and the fifth slot 4533 may form a power pattern of the second signal plate 4531.

The second ground layer 454 may include a second ground plate 4541. In an example embodiment, the second ground plate 4541 may perform a shielding function of the PCB 450. In an example embodiment, the second ground plate 4541 may be made of a conductive material (e.g., metal). In an example embodiment, the second ground plate 4541 may be in the shape of a plate.

The first dielectric 455 may bond the first ground plate 4521 and the second signal plate 4531. The second dielectric 456 may bond the second signal plate 4531 and the second ground plate 4541. In an example embodiment, the first dielectric 455 may have a first permittivity (e.g., about "3.4"), and the second dielectric 456 may have a second permittivity (e.g., about "4.2") greater than the first permittivity. In an example embodiment, the second dielectric 456 may be used for insulation.

Referring to FIGS. 5A to 5D, a PCB 550 (e.g., the PCB 450 of FIGS. 4A to 4E) according to an example embodiment may include a first signal layer 551 (e.g., the first signal layer 451) including a first signal plate 5511 (e.g., the first signal plate 4511) in which a length pattern 5518 (e.g., the length pattern 4518) is formed, a first ground layer 552 (e.g., the first ground layer 452) including a first ground plate 5521 (e.g., the first ground plate 4521), a second signal layer 553 (e.g., the second signal layer 453) including a second signal plate 5531 (e.g., the second signal plate 4531), a second ground layer 554 (e.g., the second ground layer 454) including a second ground plate 5541 (e.g., the second ground plate 4541), and a plurality of vias 557 (e.g., the vias 457) that connect the first signal plate 5511 and the second signal plate 5531.

The PCB 550 may include a first dielectric 555 (e.g., the first dielectric 455) between the first ground plate 5521 and the second signal plate 5531, and a second dielectric 556 (e.g., the second dielectric 456) between the second signal plate 5531 and the second ground plate 5541. The PCB 550 may include a third dielectric 558 (e.g., the dielectric 458) between the first signal plate 5511 and the first ground plate 5521.

The length pattern 5518 may have a meander or zigzag pattern. The length pattern 5518 may include a plurality of first extensions E1 (e.g., the first extensions E11, E12, and E13) and a plurality of second extensions E2 (e.g., the second extensions E21 and E22). In an example, the first length L1 of the first extension E1 may be greater than the second length L2 of the second extension E2. In an example, the first length L1 of the first extension E1 may be substantially equal to the second length L2 of the second extension E2. In an example, the first length L1 of the first extension E1 may be less than the second length L2 of the second extension E2.

In an example embodiment, the length of the length pattern 5518 may affect the inductance of a target frequency band of noise to be reduced by the PCB 550. For example, the total length obtained by summing first lengths L1 of the plurality of first extensions E1 and second lengths L2 of the plurality of second extensions E2 may be used to determine the parameter of the resonant frequency of the target frequency band.

In an example embodiment, the PCB 550 may have a double-sided capacitance structure, which is a parallel structure of a first capacitance structure and a second capacitance structure. The first ground plate 5521 and the first dielectric 555 may be disposed on one side (e.g., upper portion) of the second signal plate 5531 to form the first capacitance structure, and the second ground plate 5541 and the second dielectric 556 may be disposed on the other side (e.g., lower portion) of the second signal plate 5531 to form the second capacitance structure. Thus, the double-sided capacitance structure may affect the capacitance of the target frequency band of noise to be reduced by the PCB 550.

In an example embodiment, the area of a first area A1 of the first ground plate 5521 facing the second signal plate 5531, a first thickness H1 of the first dielectric 555, and/or a first permittivity of the first dielectric 555 may affect the first capacitance of the first capacitance structure.

In an example embodiment, the area of a second area A2 of the second ground plate 5541 facing the second signal plate 5531, a second thickness H2 of the second dielectric 556, and/or a second permittivity of the second dielectric 556 may affect the second capacitance of the second capacitance structure.

In an example embodiment, the first thickness H1 may be less than the second thickness H2. For example, the first thickness H1 may be about 7.5 µm and the second thickness H2 may be about 32.5 µm, and accordingly the first dielectric 555 may be relatively thin in comparison to the second dielectric 556.

In an example embodiment, the second permittivity may be greater than the first permittivity. For example, the first permittivity may be about "3.4" and the second permittivity may be about "4.2", and accordingly the second dielectric 556 may have relatively high permittivity in comparison to the first dielectric 555.

In an example embodiment, the first area A1, the first thickness H1 and/or the first permittivity may be designed as fixed parameters, whereas the second area A2, the second thickness H2 and/or the second permittivity may be designed as variable parameters. In other words, while fixing the design of the first capacitance structure, the desired final capacitance value of the double-sided capacitance structure may be tuned by changing the second area A2, the second thickness H2 and/or the second permittivity. Also, low impedance may be realized by changing the length of the length pattern 5518. That is, using LC resonance, effect caused by power noise in a desired band may be blocked. For example, the PCB 550 may have a structure designed with a total capacitance of about 150 pF and an inductance of about 0.7 nH to block effect caused by power noise in a global positioning system (GPS) band (e.g., band having a resonant frequency of about 1.5 GHz).

Figure 6A:
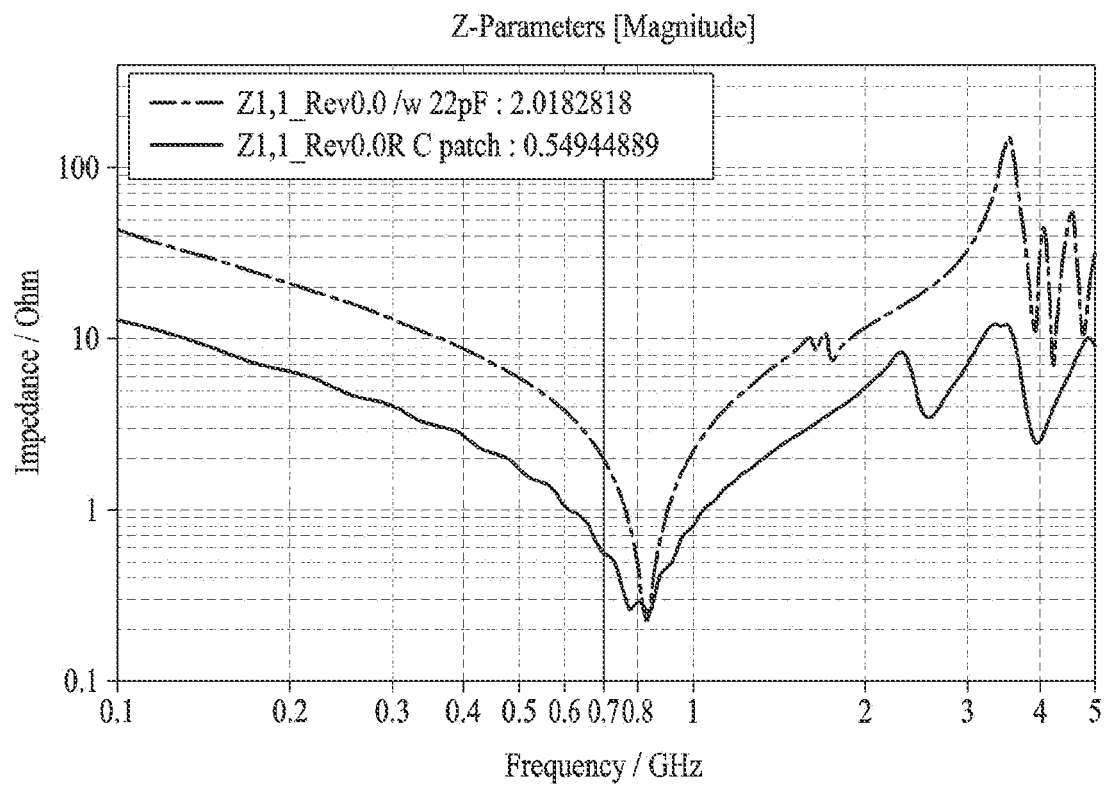
FIG. 6A illustrates a graph for comparison between an impedance of power noise generated in an FPCB according to an example embodiment and an impedance of power noise generated when a decoupling capacitor is applied.
Figure 6B:
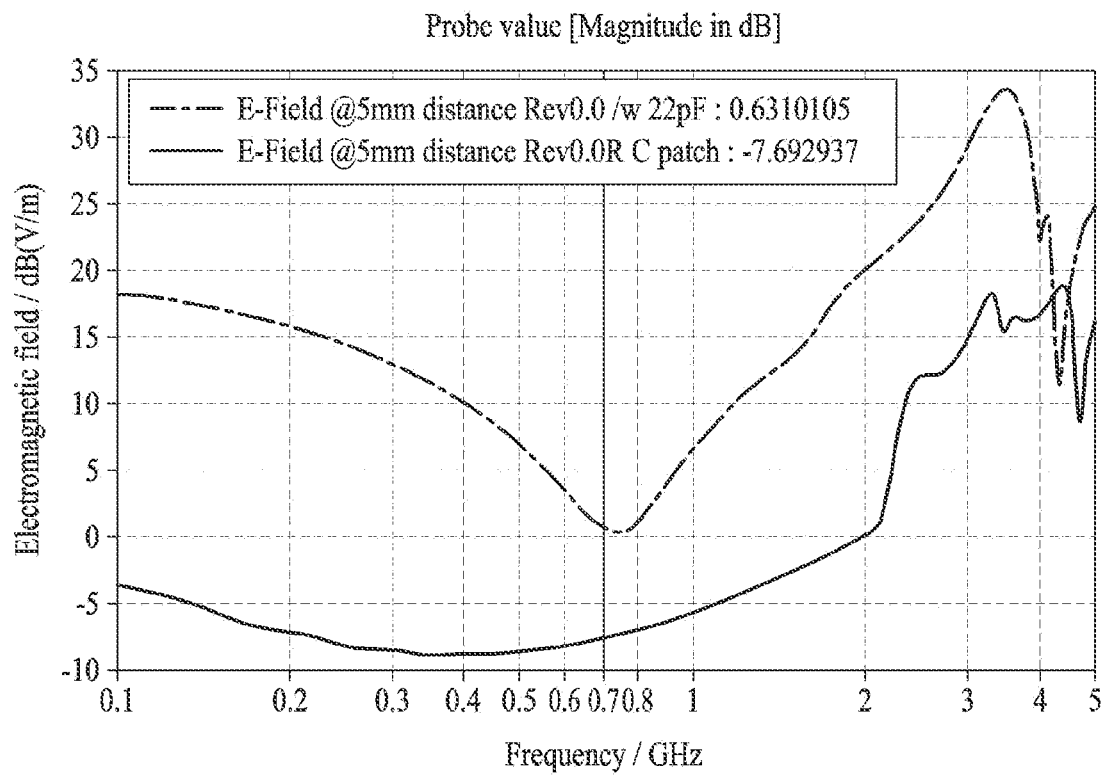
FIG. 6B illustrates a graph for comparison between a magnitude of an electromagnetic field radiated by an FPCB according to an example embodiment and a magnitude of an electromagnetic field radiated when a decoupling capacitor is applied.

FIGS. 6A and 6B illustrate a graph for comparing impedance frequency characteristics between a PCB (e.g., the PCB 450 of FIG. 4) with total capacitance of about 150 pF disclosed herein and a comparative experimental example of a decoupling capacitance of about 22 pF, and a graph for comparing magnitude of a radiated electromagnetic field between the PCB and the comparative experimental example, respectively. It may be found that the PCB has a reduced impedance of about 1.5 ohms and that a smaller amount of power switching noise is emitted, as compared to the comparative experimental example with the decoupling capacitance of 22 pF. In addition, referring to FIG. 6B showing electromagnetism simulation results, it may be found, based on the results of comparing intensities of electromagnetic fields at a distance of about 5 mm, that the PCB has a noise reduction effect of 8 dB as compared to the comparative experimental example.

FIGS. 7A to 7D illustrate length patterns 7718a, 7718b, 7718c, and 7718d according to certain example embodiments for increasing the value of a parameter (e.g., inductance) of a target frequency band. In an example embodiment, the length patterns 7718a, 7718b, 7718c, and 7718d may be formed in a stub section (e.g., the stub section 4513) of a signal plate (e.g., the first signal plate 4511) of a PCB (e.g., the PCB 450 of FIGS. 4A to 4E). In an example embodiment, the length patterns 7718a, 7718b, 7718c, and 7718d (e.g., the length pattern 4518 of FIG. 4B or the length pattern 5518 of FIG. 5A) may include a first end portion EA adjacent to a central portion C, a second end portion EB away from the central portion C, and an extension E (e.g., the first extensions E11, E12, and E13, and the second extensions E21 and E22 of FIG. 4B) that extends in a direction (e.g., counterclockwise direction) to at least partially enclose the central portion C between the first end portion EA and the second end portion EB. In an example embodiment, the extension E may extend, for example, one or more times (e.g., three times), in the counterclockwise direction to at least partially enclose the central portion C. In an example embodiment, the first end portion EA may be substantially disposed in the central portion C.

Figure 7A:
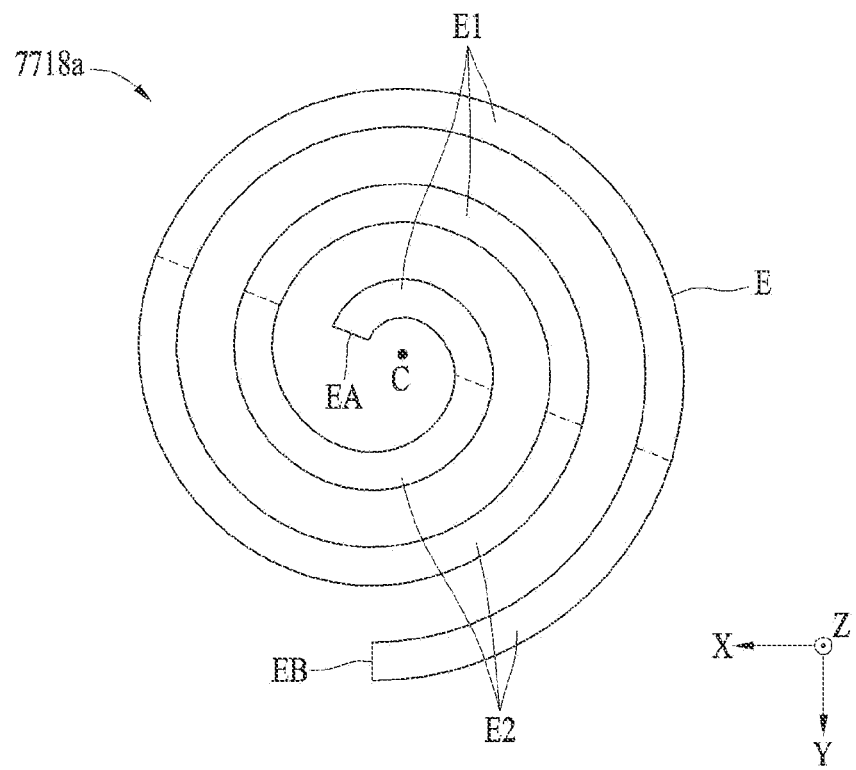
FIG. 7A is a plan view of a length pattern according to an example embodiment.

Referring to FIG. 7A, the extension E may include at least one first circumferential extension E1 that extends by a first angle (e.g., about 180 degrees) around the central portion C, and at least one second circumferential extension E2 that is connected to the first circumferential extension E1 and that extends by a second angle (e.g., about 0 degrees to about 180 degrees) around the central portion C.

Figure 7B:
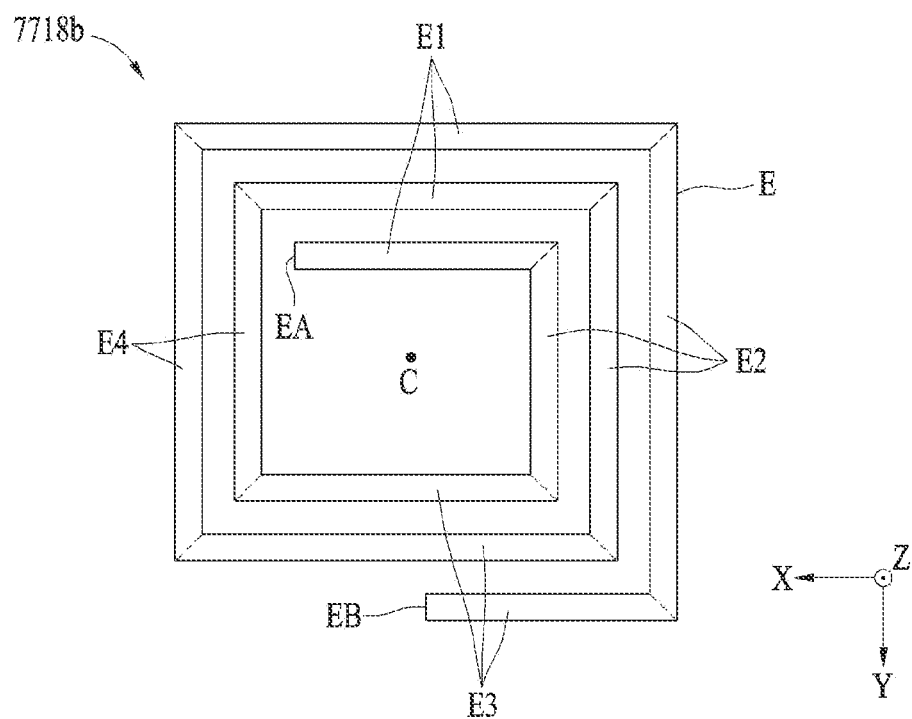
FIG. 7B is a plan view of a length pattern according to an example embodiment.

Referring to FIG. 7B, the extension E may include at least one first extension E1 that extends in a first direction (e.g., the −/+X direction), at least one second extension E2 that is connected to the first extension E1 and that extends in a second direction (e.g., the +/−Y direction) crossing the first direction, at least one third extension E3 that is connected to the second extension E2 and that extends in a third direction (e.g., the +/−X direction) crossing the second direction and opposite to the first direction, and at least one fourth extension E4 that is connected to the third extension E3 and that extends in a fourth direction (e.g., the −/+Y direction) crossing the third direction and opposite to the second direction.

In an example embodiment, the first extension E1 and the third extension E3 may be substantially parallel to each other. In an example embodiment, the second extension E2 and the fourth extension E4 may be substantially parallel to each other.

In an example, the extension E may include a plurality of first extensions E1, a plurality of second extensions E2, a plurality of third extensions E3, and a plurality of fourth extensions E4. In this example, the plurality of first extensions E1 may be spaced apart from each other in a direction away from the central portion C, the plurality of second extensions E2 may be spaced apart from each other in the direction away from the central portion C, the plurality of third extensions E3 may be spaced apart from each other in the direction away from the central portion C, and the plurality of fourth extensions E4 may be spaced apart from each other in the direction away from the central portion C.

In an example, the extension E may include a plurality of first extensions E1, a plurality of second extensions E2, a plurality of third extensions E3, and a plurality of fourth extensions E4. In this example, at least a portion of the plurality of fourth extensions E4 may be connected to the first extension E1.

In an example, the extension E may include a plurality of first extensions E1, a plurality of second extensions E2, a plurality of third extensions E3, and a plurality of fourth extensions E4. In this example, the third extension E3 farthest away from the central portion C in the plurality of third extensions E3 may have the second end portion EB. In an example, a first extension E1, a second extension E2, or a fourth extension E4 farthest away from the central portion C may also have the second end portion EB.

Figure 7C:
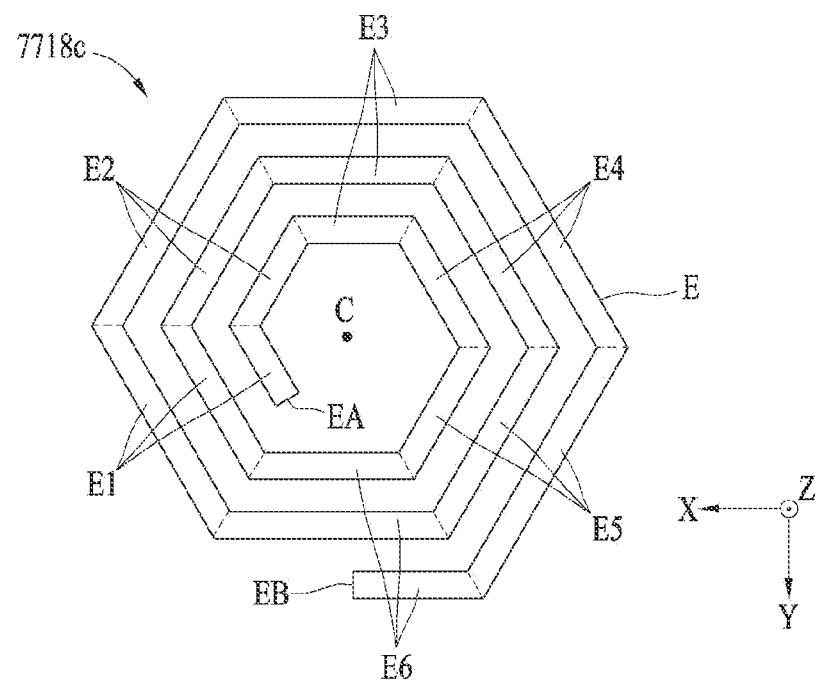
FIG. 7C is a plan view of a length pattern according to an example embodiment.

Referring to FIG. 7C, the extension E may include at least one first extension E1, at least one second extension E2 connected to the first extension E1, at least one third extension E3 connected to the second extension E2, at least one fourth extension E4 connected to the third extension E3, at least one fifth extension E5 connected to the fourth extension E4, and at least one sixth extension E6 connected to the fifth extension E5.

The first extension E1 may extend in a first direction (e.g., a direction of about +120 degrees when the central portion C is assumed as an origin in FIG. 7C). The second extension E2 may form a first angle (e.g., about 120 degrees) in one rotational direction (e.g., counterclockwise direction) with respect to the first extension E1 and may extend in a second direction (e.g., a direction of about +60 degrees when the central portion C is assumed as the origin in FIG. 7C). The third extension E3 may form a second angle (e.g., about 120 degrees) in the rotational direction with respect to the second extension E2 and may extend in a third direction (e.g., a direction of about 0 degrees when the central portion C is assumed as the origin in FIG. 7C). The fourth extension E4 may form a third angle (e.g., about 120 degrees) in the rotational direction with respect to the third extension E3 and may extend in a fourth direction (e.g., a direction of about −60 degrees when the central portion C is assumed as the origin in FIG. 7C). The fifth extension E5 may form a fourth angle (e.g., about 120 degrees) in the rotational direction with respect to the fourth extension E4 and may extend in a fifth direction (e.g., a direction of about −120 degrees when the central portion C is assumed as the origin in FIG. 7C). The sixth extension E6 may form a fifth angle (e.g., about 120 degrees) with respect to the fifth extension E5 and may extend in a sixth direction (e.g., a direction of about −180 degrees when the central portion C is assumed as the origin in FIG. 7C).

In an example embodiment, the first extension E1 and the fourth extension E4 may be substantially parallel to each other. In an example embodiment, the second extension E2 and the fifth extension E5 may be substantially parallel to each other. In an example embodiment, the third extension E3 and the sixth extension E6 may be substantially parallel to each other.

In an example, the extension E may include a plurality of first extensions E1, a plurality of second extensions E2, a plurality of third extensions E3, a plurality of fourth extensions E4, a plurality of fifth extensions E5, and a plurality of sixth extensions E6. In this example, at least one of the plurality of sixth extensions E6 may be connected to a first extension E1.

In an example, the extension E may include a plurality of first extensions E1, a plurality of second extensions E2, a plurality of third extensions E3, a plurality of fourth extensions E4, a plurality of fifth extensions E5, and a plurality of sixth extensions E6. In this example, the sixth extension E6 farthest away from the central portion C in the plurality of sixth extensions E6 may have the second end portion EB. In an example, a first extension E1, a second extension E2, a third extension E3, a fourth extension E4, or a fifth extension E5 farthest away from the central portion C may also have the second end portion EB.

Figure 7D:
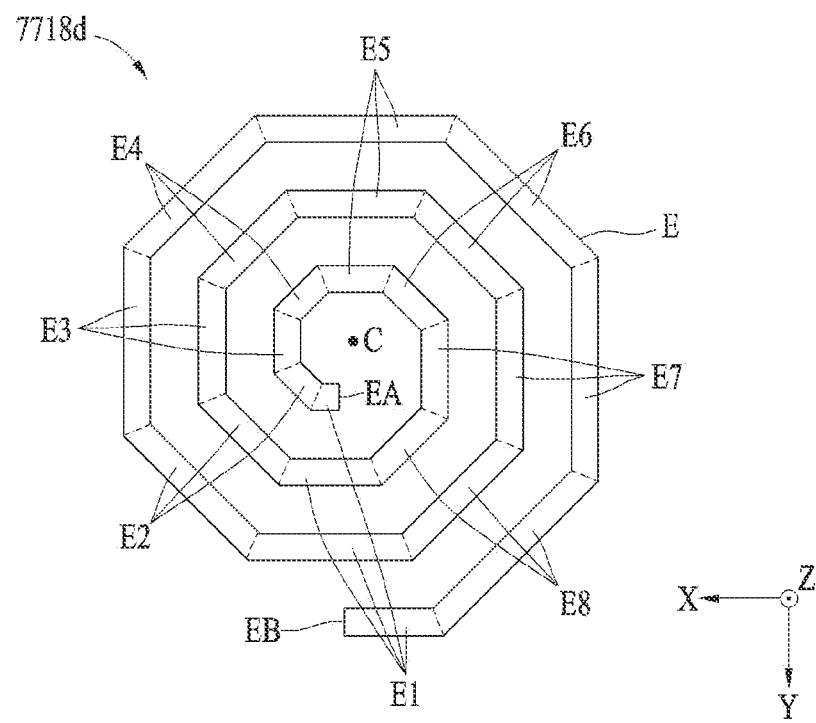
FIG. 7D is a plan view of a length pattern according to an example embodiment.

Referring to FIG. 7D, the extension E may include at least one first extension E1, at least one second extension E2 connected to the first extension E1, at least one third extension E3 connected to the second extension E2, at least one fourth extension E4 connected to the third extension E3, at least one fifth extension E5 connected to the fourth extension E4, at least one sixth extension E6 connected to the fifth extension E5, at least one seventh extension E7 connected to the sixth extension E6, and at least one eighth extension E8 connected to the seventh extension E7.

The first extension E1 may extend in a first direction (e.g., a direction of about +180 degrees when the central portion C is assumed as the origin in FIG. 7D). The second extension E2 may form a first angle (e.g., about 135 degrees) in one rotational direction (e.g., the counterclockwise direction) with respect to the first extension E1 and may extend in a second direction (e.g., a direction of about +135 degrees when the central portion C is assumed as the origin in FIG. 7D). The third extension E3 may form a second angle (e.g., about 135 degrees) in the rotational direction with respect to the second extension E2 and may extend in a third direction (e.g., a direction of about +90 degrees when the central portion C is assumed as the origin in FIG. 7D). The fourth extension E4 may form a third angle (e.g., about 135 degrees) in the rotational direction with respect to the third extension E3 and may extend in a fourth direction (e.g., a direction of about +45 degrees when the central portion C is assumed as the origin in FIG. 7D). The fifth extension E5 may form a fourth angle (e.g., about 135 degrees) in the rotational direction with respect to the fourth extension E4 and may extend in a fifth direction (e.g., a direction of about 0 degrees when the central portion C is assumed as the origin in FIG. 7D). The sixth extension E6 may form a fifth angle (e.g., about 135 degrees) with respect to the fifth extension E5 and may extend in a sixth direction (e.g., a direction of about −45 degrees when the central portion C is assumed as the origin in FIG. 7D). The seventh extension E7 may form a sixth angle (e.g., about 135 degrees) with respect to the sixth extension E6 and may extend in a seventh direction (e.g., a direction of about −90 degrees when the central portion C is assumed as the origin in FIG. 7D). The eighth extension E8 may form a seventh angle (e.g., about 135 degrees) with respect to the seventh extension E7 and may extend in an eighth direction (e.g., a direction of about −135 degrees when the central portion C is assumed as the origin in FIG. 7D).

In an example embodiment, the first extension E1 and the fifth extension E5 may be substantially parallel to each other. In an example embodiment, the second extension E2 and the sixth extension E6 may be substantially parallel to each other. In an example embodiment, the third extension E3 and the seventh extension E7 may be parallel to each other. In an example embodiment, the fourth extension E4 and the eighth extension E8 may be substantially parallel to each other.

In an example, the extension E may include a plurality of first extensions E1, a plurality of second extensions E2, a plurality of third extensions E3, a plurality of fourth extensions E4, a plurality of fifth extensions E5, a plurality of sixth extensions E6, a plurality of seventh extensions E7, and a plurality of eighth extensions E8. In this example, at least one of the plurality of eighth extensions E8 may be connected to a first extension E1.

In an example, the extension E may include a plurality of first extensions E1, a plurality of second extensions E2, a plurality of third extensions E3, a plurality of fourth extensions E4, a plurality of fifth extensions E5, a plurality of sixth extensions E6, a plurality of seventh extensions E7, and a plurality of eighth extensions E8. In this example, the first extension E1 farthest away from the central portion C in the plurality of first extensions E1 may have the second end portion EB. In an example, a second extension E2, a third extension E3, a fourth extension E4, a fifth extension E5, a sixth extension E6, a seventh extension E7, or an eighth extension E8 farthest away from the central portion C may also have the second end portion EB.

Figure 8A:
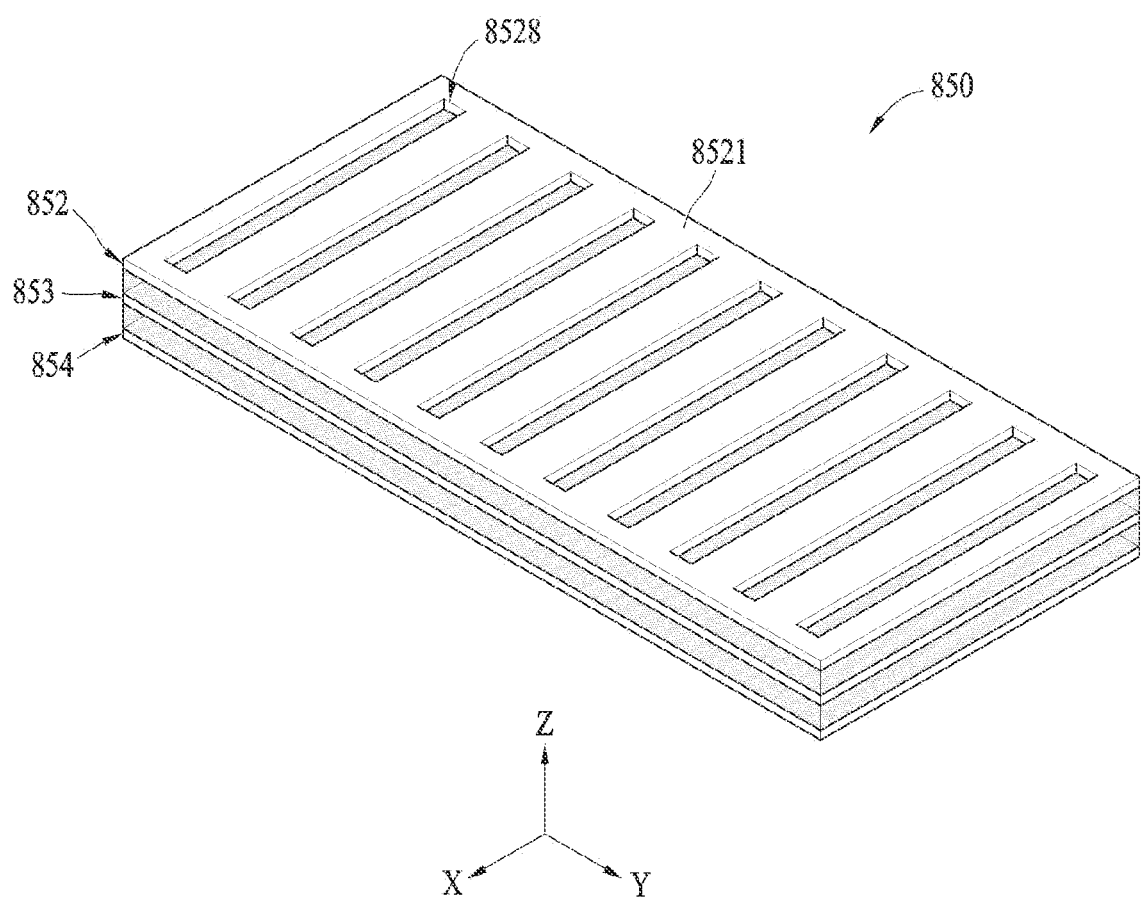
FIG. 8A is a perspective view schematically illustrating an FPCB without a first signal layer according to an example embodiment.
Figure 8B:
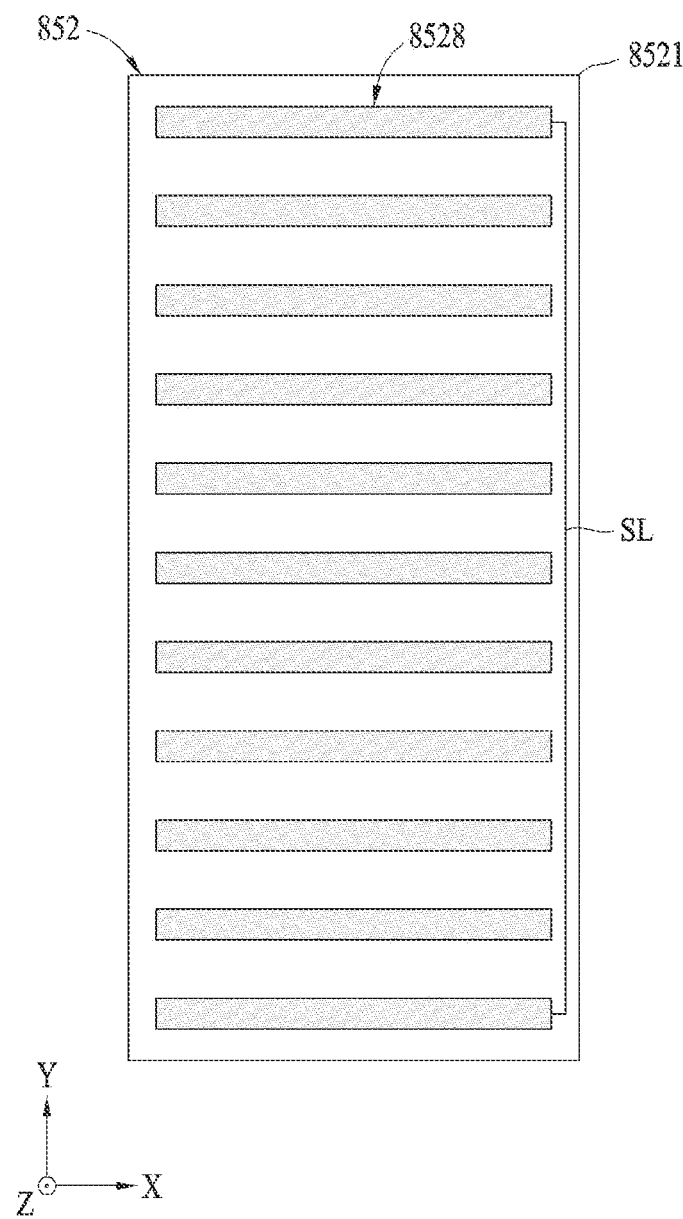
FIG. 8B is a plan view schematically illustrating a first ground layer according to an example embodiment.

Referring to FIGS. 8A and 8B, a PCB 850 (e.g., the PCB 550 of FIGS. 5A to 5D) according to an example embodiment may include a first signal layer (e.g., the first signal layer 551) including a first signal plate (e.g., the first signal plate 5511) (not shown), a first ground layer 852 (e.g., the first ground layer 552) including a first ground plate 8521 (e.g., the first ground plate 5521), a second signal layer 853 (e.g., the second signal layer 553) including a second signal plate (e.g., the second signal plate 5531), a second ground layer 854 (e.g., the second ground layer 554) including a second ground plate (e.g., the second ground plate 5541), a plurality of vias (e.g., the vias 557) that connect the first signal plate and the second signal plate, a first dielectric (e.g., the first dielectric 555) between the first ground plate 8521 and the second signal plate, a second dielectric (e.g., the second dielectric 556) between the second signal plate and the second ground plate, and a third dielectric (e.g., the third dielectric 558) between the first signal plate and the first ground plate 8521.

The first ground layer 852 may include a slot pattern 8528 formed in the first ground plate 8521. The slot pattern 8528 may increase the length of an electrical path of the first ground plate 8521 and a length (e.g., length in the X direction or length in the Y direction) of an electrical path of the second signal plate of the second signal layer 853. For example, the slot pattern 8528 may include a plurality of slots SL that extend in a first direction (e.g., the +/−X direction) of the first ground plate 8521 and that are spaced apart from each other and arranged in a second direction (e.g., the +/−Y direction) crossing the first direction.

In an example embodiment, lengths of the plurality of slots SL extending in the first direction (e.g., the +/−X direction) may be substantially the same. In an example embodiment, widths of the plurality of slots SL corresponding to the second direction (e.g., the +/−Y direction) may be substantially the same. In an example embodiment, a gap between a pair of neighboring slots SL may be substantially the same as a gap between another pair of neighboring slots SL.

Figure 9:
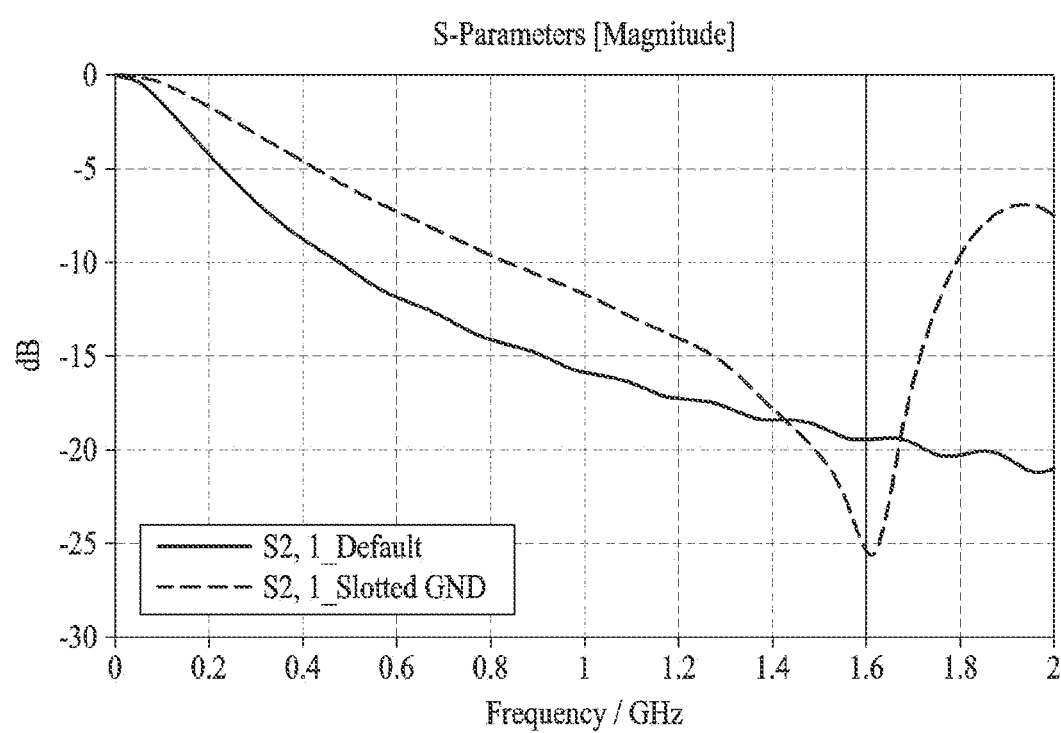
FIG. 9 illustrates a graph for comparison between an impedance of power noise generated in FPCBs of FIGS. 8A and 8B with a slot structure and an impedance of power noise generated in an FPCB without a slot structure.

FIG. 9 illustrates a graph for comparison between an impedance of power noise of a PCB (e.g., the PCB 850 of FIG. 8A) including a first ground plate (e.g., the first ground plate 8521 of FIGS. 8A and 8B) in which a slot pattern (e.g., the slot pattern 8528 of FIGS. 8A and 8B) is formed and an impedance of power noise of a PCB (e.g., the PCB 550 of FIGS. 5A to 5D) to which the slot pattern is not applied. It may be confirmed that the impedance of the power noise of the PCB to which the slot pattern is applied has a noise reduction effect of about 6 dB in the frequency band of about 1.6 GHz, in comparison to the impedance of the power noise of the PCB to which the slot pattern is not applied.

According to an example embodiment, an electronic device 301 may include a first electronic component 390, a second electronic component 397, and a PCB 350, 450, 550 configured to connect the first electronic component 390 and the second electronic component 397 and block power noise in a target frequency band. The PCB 450, 550 may include a first signal layer 451, 551 including a first signal plate 4511, 5511 having a length pattern 4518, 5518 with a length corresponding to a first parameter of the target frequency band, a first ground layer 452, 552 including a first ground plate 4521, 5521 that is positioned below the first signal plate 4511, 5511 and that has a first area A1, a second signal layer 453, 553 including a second signal plate 4531, 5531 positioned below the first ground plate 4521, 5521, a first dielectric 455, 555 that is positioned between the first ground plate 4521, 5521 and the second signal plate 4531, 5531 and that has a first thickness H1 and a first permittivity, a second ground layer 454, 554 including a second ground plate 4541, 5541 that is positioned below the second signal plate 4531, 5531 and that has a second area A2 corresponding to a second parameter of the target frequency band, and a second dielectric 456, 556 that is positioned between the second signal plate 4531, 5531 and the second ground plate 4541, 5541 and that has a second thickness H2 and a second permittivity corresponding to the second parameter.

In an example embodiment, the length pattern 4518, 5518 may include a first extension E11, E12, E13, E1 extending in a first direction of the first signal plate 4511, 5511, and a second extension E21, E22, E2 extending from the first extension E11, E12, E13, E1.

In an example embodiment, the first extension E11, E12, E13, E1 may have a first length L1, the second extension E21, E22, E2 may have a second length L2, and the first length L1 may be substantially equal to or greater than the second length L2.

In an example embodiment, the length pattern 4518, 5518 may further include an additional first extension E11, E12, E13, E1 that extends from the second extension E21, E22, E2 in a direction substantially opposite to the first direction and that is spaced apart from the first extension E11, E12, E13, E1.

In an example embodiment, the first signal plate 4511, 5511 may include a stub section 4513 including the length pattern 4518, 5518, and a non-stub section 4514 spaced apart from section 4513. A slot 4516 may be formed between the stub section 4513 and the non-stub section 4514.

In an example embodiment, the length pattern 4518, 5518 may include a plurality of first extensions E11, E12, E13, and E1 that extend in a first direction of the first signal plate 4511, 5511 and that are arranged in a second direction of the first signal plate 4511, 5511 different from the first direction, and a plurality of second extensions E21, E22, and E2 configured to connect the plurality of first extensions E11, E12, E13, and E1 and each one of the plurality of second extensions E21, E22, and E2 extending along at least a portion of the slot 4516 from a corresponding one of the plurality of first extensions E11, E12, E13, and E1.

In an example embodiment, a length pattern 7718a, 7718b, 7718c, 7718d may have a central portion C. The length pattern 7718a, 7718b, 7718c, 7718d may include an extension E that extends in a direction to enclose the central portion C at a periphery of the central portion C.

In an example embodiment, the first signal plate 4511, 5511 may include a first connector section 350a connected to the first electronic component 390, and a second connector section 350b connected to the second electronic component 397.

In an example embodiment, the first thickness H1 may be less than the second thickness H2.

In an example embodiment, the second permittivity may be greater than the first permittivity.

In an example embodiment, the first ground layer 852 may further include a slot pattern 8528 formed in a first ground plate 8521. The slot pattern 8528 may include a plurality of slots SL that extend in a first direction of the first ground plate 8521 and that are arranged in a second direction different from the first direction.

In an example embodiment, the first electronic component 390 may include a communication module, and the second electronic component 397 may include an antenna module.

A PCB 350, 450, 550 according to an example embodiment may be a PCB configured to block power noise in a target frequency band, and may include a first signal layer 451, 551 including a first signal plate 4511, 5511 having a length pattern 4518, 5518 with a length corresponding to a first parameter of the target frequency band, a first ground layer 452, 552 including a first ground plate 4521, 5521, the first ground plate 4521, 5521 being positioned below the first signal plate 4511, 5511 and having a first area A1, a second signal layer 453, 553 including a second signal plate 4531, 5531 positioned below the first ground plate 4521, 5521, a first dielectric 455, 555 positioned between the first ground plate 4521, 5521 and the second signal plate 4531, 5531 and having a first thickness H1 and a first permittivity, a second ground layer 454, 554 including a second ground plate 4541, 5541, the second ground plate 4541, 5541 being positioned below the second signal plate 4531, 5531 and having a second area A2 corresponding to a second parameter of the target frequency band, and a second dielectric 456, 556 positioned between the second signal plate 4531, 5531 and the second ground plate 4541, 5541, the second dielectric 456, 556 having a second thickness H2 and a second permittivity corresponding to the second parameter.

In an example embodiment, the length pattern 4518, 5518 may include a first extension E11, E12, E13, E1 extending in a first direction of the first signal plate 4511, 5511, and a second extension E21, E22, E2 extending from the first extension E11, E12, E13, E1.

In an example embodiment, the first extension E11, E12, E13, E1 may have a first length L1, the second extension E21, E22, E2 may have a second length L2, and the first length L1 may be substantially equal to or greater than the second length L2.

In an example embodiment, the length pattern 4518, 5518 may further include an additional first extension E11, E12, E13, E1 that extends from the second extension E21, E22, E2 in a direction substantially opposite to the first direction and that is spaced apart from the first extension E11, E12, E13, E1.

In an example embodiment, the first signal plate 4511, 5511 may include a stub section 4513 including the length pattern 4518, 5518, and a non-stub section 4514 spaced apart from section 4513. A slot 4516 may be formed between the stub section 4513 and the non-stub section 4514.

In an example embodiment, the length pattern 4518, 5518 may include a plurality of first extensions E11, E12, E13, and E1 that extend in a first direction of the first signal plate 4511, 5511 and that are arranged in a second direction of the first signal plate 4511, 5511 different from the first direction, and a plurality of second extensions E21, E22, and E2 configured to connect the plurality of first extensions E11, E12, E13, and E1 and each one of the plurality of second extensions E21, E22, and E2 extending along at least a portion of the slot 4516 from a corresponding one of the plurality of first extensions E11, E12, E13, and E1.

In an example embodiment, a length pattern 7718a, 7718b, 7718c, 7718d may have a central portion C. The length pattern 7718a, 7718b, 7718c, 7718d may include an extension E that extends in a direction to enclose the central portion C at a periphery of the central portion C.

In an example embodiment, the first signal plate 4511, 5511 may include a first connector section 350a connected to the first electronic component 390, and a second connector section 350b connected to the second electronic component 397.

In an example embodiment, the first thickness H1 may be less than the second thickness H2.

In an example embodiment, the second permittivity may be greater than the first permittivity.

In an example embodiment, the first ground layer 852 may further include a slot pattern 8528 formed in a first ground plate 8521. The slot pattern 8528 may include a plurality of slots SL that extend in a first direction of the first ground plate 8521 and that are arranged in a second direction different from the first direction.

An electronic device 301, 401, 501 according to an example embodiment may include a power management module 388, an antenna module 397, and an FPCB 350, 450, 550 configured to connect the power management module 388 and the antenna module 397 and block power noise in a target frequency band. The FPCB 350, 450, 550 may include a first signal layer 451, 551 including a first signal plate 4511, 5511, the first signal plate 4511, 5511 having a length pattern 4518, 5518 with a length corresponding to an inductance of the target frequency band, a first ground layer 452, 552 including a first ground plate 4521, 5521, the first ground plate 4521, 5521 being positioned below the first signal plate 4511, 5511 and having a first area A1, a second signal layer 453, 553 including a second signal plate 4531, 5531 positioned below the first ground plate 4521, 5521, a first dielectric 455, 555 positioned between the first ground plate 4521, 5521 and the second signal plate 4531, 5531 and having a first thickness H1 and a first permittivity, a second ground layer 454, 554 including a second ground plate 4541, 5541, the second ground plate 4541, 5541 being positioned below the second signal plate 4531, 5531 and having a second area A2 corresponding to a capacitance of the target frequency band, and a second dielectric 456, 556 positioned between the second signal plate 4531, 5531 and the second ground plate 4541, 5541, the second dielectric 456, 556 having a second thickness H2 and a second permittivity corresponding to the capacitance.

What is claimed is:

1. An electronic device comprising:
    a first electronic component;
    a second electronic component; and
    a printed circuit board (PCB) configured to connect the first electronic component and the second electronic component and block power noise in a target frequency band,
    wherein the PCB comprises:
        a first signal layer comprising a first signal plate, the first signal plate having a length pattern with a length corresponding to a first parameter of the target frequency band;
        a first ground layer comprising a first ground plate, the first ground plate being positioned below the first signal plate and having a first area;
        a second signal layer comprising a second signal plate positioned below the first ground plate;
        a first dielectric positioned between the first ground plate and the second signal plate, the first dielectric having a first thickness and a first permittivity;
        a second ground layer comprising a second ground plate, the second ground plate being positioned below the second signal plate and having a second area corresponding to a second parameter of the target frequency band; and
        a second dielectric positioned between the second signal plate and the second ground plate, the second dielectric having a second thickness and a second permittivity corresponding to the second parameter.

2. The electronic device of claim 1, wherein the length pattern further comprises:
    a first extension extending in a first direction of the first signal plate; and
    a second extension extending from the first extension.

3. The electronic device of claim 2, wherein:
    the first extension has a first length,
    the second extension has a second length, and
    the first length is equal to or greater than the second length.

4. The electronic device of claim 2, wherein the length pattern further comprises an additional first extension that extends from the second extension in a direction substantially opposite to the first direction and that is spaced apart from the first extension.

5. The electronic device of claim 1, wherein the first signal plate further comprises:
    a stub section including the length pattern;
    a non-stub section spaced apart from the stub section; and
    a slot formed between the non-stub section and the stub section.

6. The electronic device of claim 5, wherein the length pattern further comprises:
    a plurality of first extensions that extend in a first direction of the first signal plate and that are arranged in a second direction of the first signal plate different from the first direction; and
    a plurality of second extensions configured to connect the plurality of first extensions, each of the plurality of second extensions extending along at least a portion of the slot from a corresponding one of the plurality of first extensions.

7. The electronic device of claim 1, wherein:
    the length pattern has a central portion, and
    the length pattern comprises an extension that extends in a direction to enclose the central portion at a periphery of the central portion.

8. The electronic device of claim 1, wherein the first signal plate further comprises:
    a first connector section connected to the first electronic component; and
    a second connector section connected to the second electronic component.

9. The electronic device of claim 1, wherein the first thickness is less than the second thickness.

10. The electronic device of claim 1, wherein the second permittivity is greater than the first permittivity.

11. The electronic device of claim 1, wherein:
    the first ground layer further comprises a slot pattern formed in the first ground plate, and
    the slot pattern comprises a plurality of slots that extend in a first direction of the first ground plate and that are arranged in a second direction different from the first direction.

12. The electronic device of claim 1, wherein:
    the first electronic component comprises a communication module, and
    the second electronic component comprises an antenna module.

13. A printed circuit board (PCB) configured to block power noise in a target frequency band, the PCB comprising:
    a first signal layer comprising a first signal plate, the first signal plate having a length pattern with a length corresponding to a first parameter of the target frequency band;
    a first ground layer comprising a first ground plate, the first ground plate being positioned below the first signal plate and having a first area;
    a second signal layer comprising a second signal plate positioned below the first ground plate;
    a first dielectric positioned between the first ground plate and the second signal plate, the first dielectric having a first thickness and a first permittivity;
    a second ground layer comprising a second ground plate, the second ground plate being positioned below the second signal plate and having a second area corresponding to a second parameter of the target frequency band; and
    a second dielectric positioned between the second signal plate and the second ground plate, the second dielectric having a second thickness and a second permittivity corresponding to the second parameter.

14. The PCB of claim 13, wherein the length pattern further comprises:
   a first extension extending in a first direction of the first signal plate; and
   a second extension extending from the first extension.

15. The PCB of claim 14, wherein:
   the first extension has a first length,
   the second extension has a second length, and
   the first length is equal to or greater than the second length.

16. The PCB of claim 14, wherein the length pattern further comprises an additional first extension that extends from the second extension in a direction substantially opposite to the first direction and that is spaced apart from the first extension.

17. The PCB of claim 13, wherein the first signal plate further comprises:
   a stub section including the length pattern;
   a non-stub section spaced apart from the stub section; and
   a slot formed between the non-stub section and the stub section.

18. The PCB of claim 17, wherein the length pattern further comprises:
   a plurality of first extensions that extend in a first direction of the first signal plate and that are arranged in a second direction of the first signal plate different from the first direction; and
   a plurality of second extensions configured to connect the plurality of first extensions, each of the plurality of second extensions extending along at least a portion of the slot from a corresponding one of the plurality of first extensions.

19. The PCB of claim 13, wherein:
   the length pattern has a central portion, and
   the length pattern comprises an extension that extends in a direction to enclose the central portion at a periphery of the central portion.

20. The PCB of claim 13, wherein the first signal plate further comprises:
   a first connector section connected to a first electronic component; and
   a second connector section connected to a second electronic component.

21. The PCB of claim 13, wherein the first thickness is less than the second thickness.

22. The PCB of claim 13, wherein the second permittivity is greater than the first permittivity.

23. The PCB of claim 13, wherein:
   the first ground layer further comprises a slot pattern formed in the first ground plate, and
   the slot pattern comprises a plurality of slots that extend in a first direction of the first ground plate and that are arranged in a second direction different from the first direction.

24. An electronic device comprising:
   a power management module;
   an antenna module; and
   a flexible printed circuit board (FPCB) configured to connect the power management module and the antenna module and block power noise in a target frequency band,
   wherein the FPCB comprises:
      a first signal layer comprising a first signal plate, the first signal plate having a length pattern having a length corresponding to an inductance of the target frequency band;
      a first ground layer comprising a first ground plate, the first ground plate being positioned below the first signal plate and having a first area;
      a second signal layer comprising a second signal plate positioned below the first ground plate;
      a first dielectric positioned between the first ground plate and the second signal plate, the first dielectric having a first thickness and a first permittivity;
      a second ground layer comprising a second ground plate, the second ground plate being positioned below the second signal plate and having a second area corresponding to a capacitance of the target frequency band; and
      a second dielectric positioned between the second signal plate and the second ground plate, the second dielectric having a second thickness and a second permittivity corresponding to the capacitance.

* * * * *